US009476898B2

(12) United States Patent
Takano

(10) Patent No.: US 9,476,898 B2
(45) Date of Patent: Oct. 25, 2016

(54) SENSOR DEVICE AND MANUFACTURING METHOD THEREOF

(75) Inventor: Takamasa Takano, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 13/475,056

(22) Filed: May 18, 2012

(65) Prior Publication Data

US 2012/0248553 A1  Oct. 4, 2012

Related U.S. Application Data

(63) Continuation of application No. PCT/JP2010/070617, filed on Nov. 18, 2010.

(30) Foreign Application Priority Data

Nov. 19, 2009  (JP) .................................. 2009-263929
Oct. 1, 2010  (JP) .................................. 2010-224332

(51) Int. Cl.
*H01L 29/49*  (2006.01)
*G01P 1/02*  (2006.01)
*B81C 1/00*  (2006.01)

(52) U.S. Cl.
CPC .............. *G01P 1/023* (2013.01); *B81C 1/0023* (2013.01); *B81B 2201/0235* (2013.01); *B81B 2207/012* (2013.01); *B81B 2207/053* (2013.01); *B81B 2207/096* (2013.01); *B81C 2203/0118* (2013.01); *B81C 2203/0792* (2013.01); *H01L 2224/48091* (2013.01); *H01L 2224/48137* (2013.01)

(58) Field of Classification Search
CPC ...................................................... G01P 1/023

USPC .......... 381/355; 257/E23.193, E21.499, 686, 257/701, 718, 728, 786, 415
See application file for complete search history.

(56) References Cited

U.S. PATENT DOCUMENTS 2,361,589 A * 10/1944 Bennett et al. .......... 351/159.57
5,949,073 A *  9/1999 Shimoyama ............... 250/338.4
(Continued)

FOREIGN PATENT DOCUMENTS

EP  1 953 815 A1  8/2008
EP  1 953 816 A1  8/2008
(Continued)

OTHER PUBLICATIONS

International Search Report for PCT/JP2010/070617; Feb. 15, 2011.
(Continued)

*Primary Examiner* — Michael Shingleton
(74) *Attorney, Agent, or Firm* — Pearne & Gordon LLP

(57) ABSTRACT

A sensor device and a manufacturing method thereof are provided in which no resin seal is used when a sensor is packaged, a change in connection relation according to a change in specifications of the control IC and others is facilitated when a control IC is packaged together with the sensor and high reliability is kept. The sensor device of the present invention includes a substrate containing an organic material and being formed a wiring, a sensor arranged on the substrate and electrically connected to the wiring, and a package cap arranged on the substrate and containing an organic material and covering the sensor, and the inside of the package cap is hollow.

17 Claims, 15 Drawing Sheets

(56) References Cited

U.S. PATENT DOCUMENTS

| | | | | |
|---|---|---|---|---|
| 6,037,655 A * | 3/2000 | Philbrick et al. | ............ | 257/680 |
| 6,093,576 A | 7/2000 | Otani | | |
| 6,396,116 B1 * | 5/2002 | Kelly et al. | ............ | 257/432 |
| 6,552,421 B2 * | 4/2003 | Kishimoto et al. | ............ | 257/678 |
| 6,713,857 B1 * | 3/2004 | Tsai | ............ | 257/686 |
| 7,009,295 B2 * | 3/2006 | Noguchi | ............ | 257/738 |
| 7,221,051 B2 * | 5/2007 | Ono et al. | ............ | 257/704 |
| 7,224,056 B2 * | 5/2007 | Burtzlaff et al. | ............ | 257/704 |
| 7,288,766 B2 * | 10/2007 | Uchida et al. | ............ | 250/338.5 |
| 7,394,148 B2 * | 7/2008 | Karnezos | ............ | 257/686 |
| 7,414,310 B2 * | 8/2008 | Do et al. | ............ | 257/710 |
| 7,429,786 B2 * | 9/2008 | Karnezos et al. | ............ | 257/686 |
| 7,518,157 B2 * | 4/2009 | Rissing et al. | ............ | 257/98 |
| 7,595,540 B2 * | 9/2009 | Fukuda et al. | ............ | 257/431 |
| 7,701,044 B2 * | 4/2010 | Kang et al. | ............ | 257/680 |
| 7,719,097 B2 * | 5/2010 | Watanabe | ............ | 257/680 |
| 7,736,946 B2 * | 6/2010 | Seppala et al. | ............ | 438/106 |
| 7,948,069 B2 * | 5/2011 | Zhuang | ............ | 257/678 |
| 7,968,961 B2 * | 6/2011 | Yamamoto | ............ | 257/433 |
| 8,092,734 B2 * | 1/2012 | Jiang et al. | ............ | 264/249 |
| 8,389,314 B2 * | 3/2013 | Martin et al. | ............ | 438/48 |
| 8,431,977 B2 * | 4/2013 | Yang | ............ | 257/294 |
| 8,525,323 B2 * | 9/2013 | Yamazaki et al. | ............ | 257/704 |
| 8,592,959 B2 * | 11/2013 | Fujii | ............ | 257/664 |
| 8,680,669 B2 * | 3/2014 | Kurihara et al. | ............ | 257/704 |
| 8,791,536 B2 * | 7/2014 | Kinsman et al. | ............ | 257/432 |
| 2001/0050422 A1 * | 12/2001 | Kishimoto et al. | ............ | 257/678 |
| 2002/0024131 A1 * | 2/2002 | Sasano | ............ | 257/704 |
| 2004/0080044 A1 * | 4/2004 | Moriyama et al. | ............ | 257/728 |
| 2005/0205988 A1 * | 9/2005 | Radza | ............ | 257/704 |
| 2006/0024449 A1 * | 2/2006 | Cho et al. | ............ | 427/532 |
| 2008/0030205 A1 | 2/2008 | Fujii | | |
| 2008/0315333 A1 * | 12/2008 | Combi et al. | ............ | 257/415 |
| 2009/0001553 A1 * | 1/2009 | Pahl et al. | ............ | 257/704 |
| 2009/0152656 A1 | 6/2009 | Okudo et al. | | |
| 2009/0159997 A1 | 6/2009 | Okudo et al. | | |
| 2009/0236678 A1 | 9/2009 | Okudo et al. | | |
| 2009/0267165 A1 | 10/2009 | Okudo et al. | | |
| 2011/0293126 A1 * | 12/2011 | Maekawa et al. | ............ | 381/355 |

FOREIGN PATENT DOCUMENTS

| | | | |
|---|---|---|---|
| EP | 1 953 817 A1 | | 8/2008 |
| JP | 08-015302 A | | 1/1996 |
| JP | 09-061271 A | | 3/1997 |
| JP | 09-089925 A | | 4/1997 |
| JP | 2591999 Y2 | | 1/1999 |
| JP | 11-064369 A | | 3/1999 |
| JP | 3161736 B2 | | 4/2001 |
| JP | 2004-212246 A | | 7/2004 |
| JP | 2004-525357 A | | 8/2004 |
| JP | 2005-166909 A | | 6/2005 |
| JP | 2006-145410 A | | 6/2006 |
| JP | 2006-250760 A | | 9/2006 |
| JP | 2007-114064 A | | 5/2007 |
| JP | 2007-150507 | * | 6/2007 |
| JP | 3960079 B2 | | 8/2007 |
| JP | 2007-322160 A | | 12/2007 |
| JP | 2008-020433 A | | 1/2008 |
| JP | 2008-271424 | * | 6/2008 |
| JP | 2008-159882 A | | 7/2008 |
| JP | 2009-103530 A | | 5/2009 |
| JP | 4292622 B2 | | 7/2009 |
| JP | 2009-188374 A | | 8/2009 |
| JP | 2010-181243 A | | 8/2010 |
| JP | 5089767 B2 | | 12/2012 |
| JP | 5417737 B2 | | 2/2014 |
| JP | 5545281 B2 | | 7/2014 |
| WO | 02/056031 A1 | | 7/2002 |
| WO | WO 2007/061050 | * | 11/2006 |
| WO | 2007-061050 A1 | | 5/2007 |
| WO | 2007-061062 A1 | | 5/2007 |

OTHER PUBLICATIONS

International Preliminary Report for PCT/JP2010/070617; Aug. 9, 2011.
Office Action issued in corresponding Japanese Patent Application No. 2012-224332 dated Apr. 22, 2014.
Decision of Refusal issued in Japanese Patent Application No. 2010-224332 dated Dec. 2, 2014.

* cited by examiner

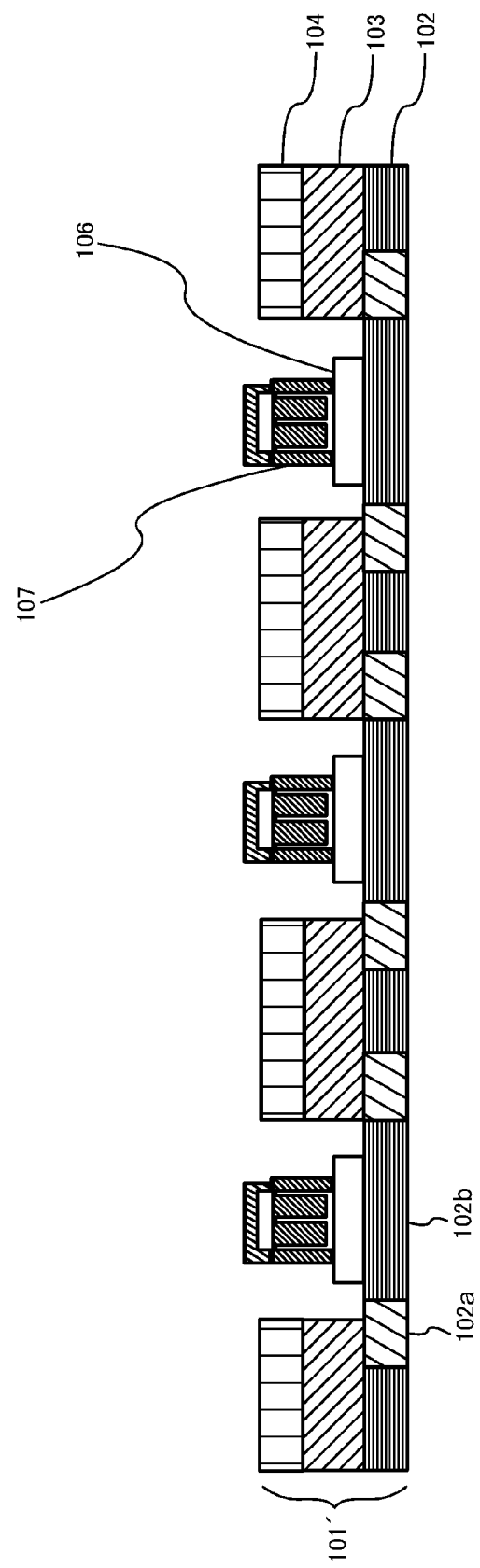

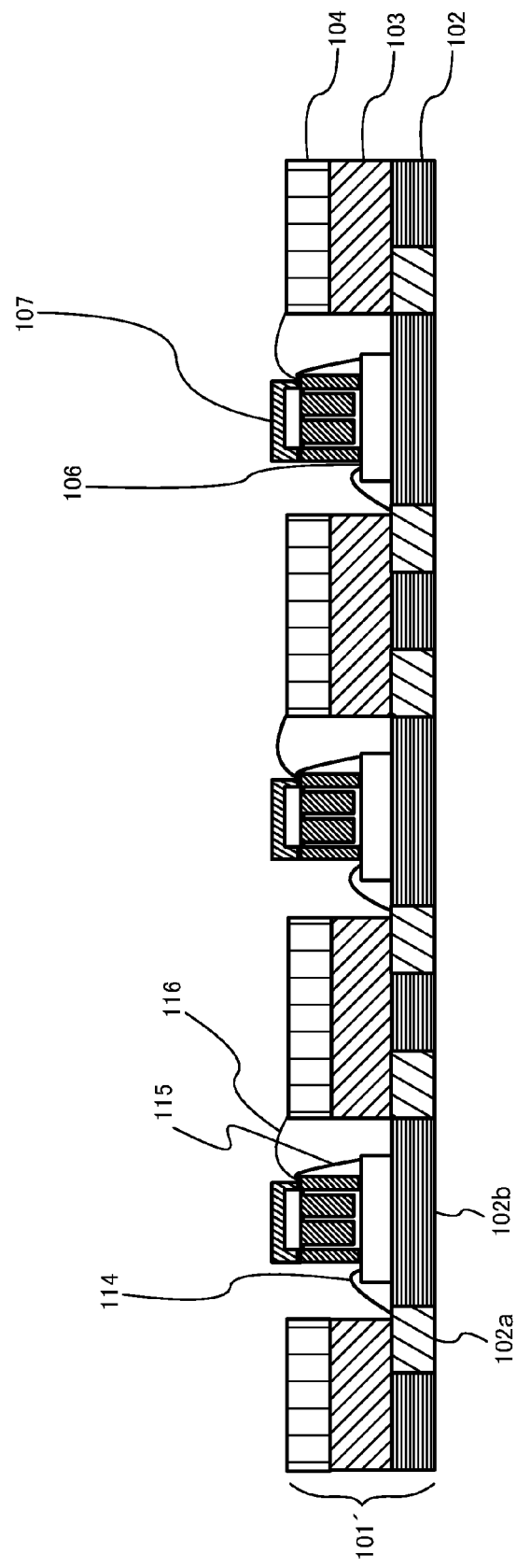

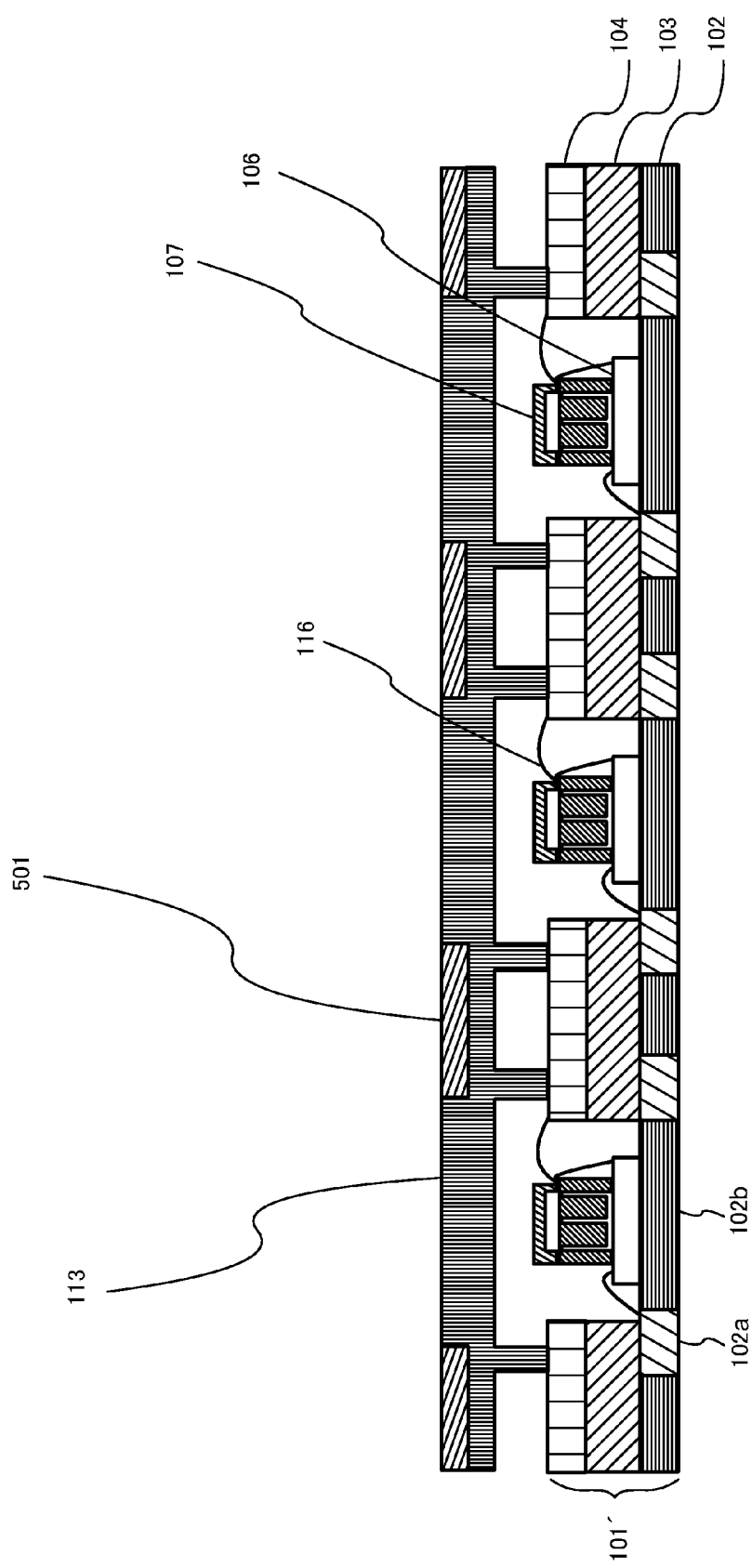

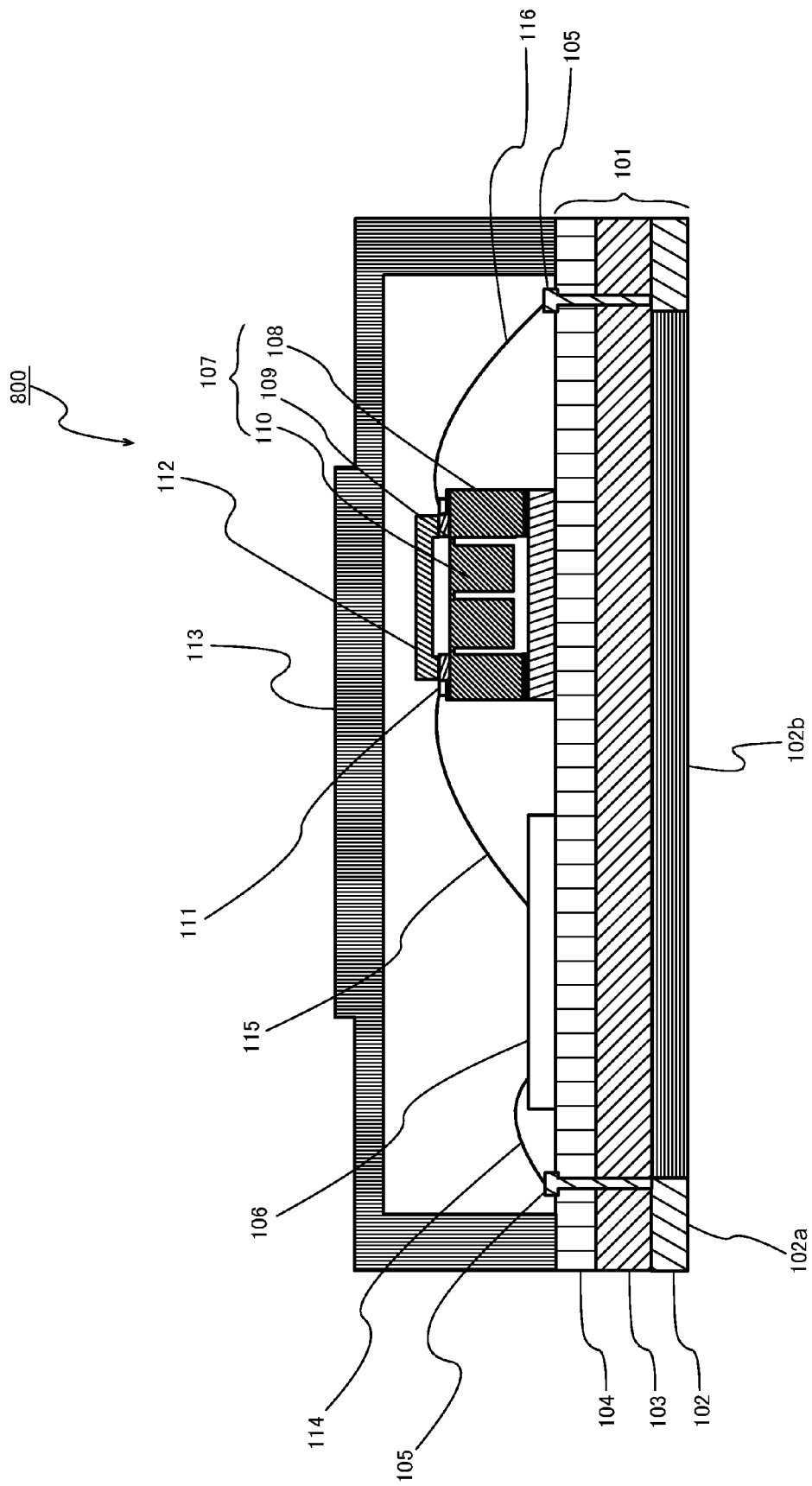

SENSOR DEVICE AND MANUFACTURING METHOD THEREOF

CROSS-REFERENCE TO RELATED APPLICATIONS

This application is based upon and claims the benefit of priority from the prior Japanese Patent Application No. 2009-263929, filed on Nov. 19, 2009, the prior Japanese Patent Application No. 2010-224332 filed on Oct. 1, 2010 and the prior International Application No. PCT/JP2010/070617, the entire contents of which are incorporated herein by reference.

FIELD

The present invention relates to a sensor device and a manufacturing method thereof. In particular, the present invention relates to a sensor device mounted on a substrate containing an organic material and adopting a hollow plastic package, and a manufacturing method thereof.

BACKGROUND

In recent years, various electronic equipment has become small in size and light in weight, multifunctional, and highly functional, and high density has been demanded for electronic equipment to be mounted. In response to this demand, various electronic components manufactured as semiconductor devices have been increased. Furthermore, other than semiconductor devices manufactured as circuit elements, various sensors are also manufactured as semiconductor devices for decreasing the size and reducing the weight. For example, in an acceleration sensor or an angular velocity sensor having a small and simple structure by using MEMS (Micro Electro Mechanical Systems) technology, a mechanical quantity sensor or the like has been put into practical use, which is of a type in which a movable part moving according to an external force is formed on a semiconductor substrate and the displacement of this movable part is detected as a change in an electrical signal.

An example of the mechanical quantity sensor described above is a triaxial acceleration sensor using piezoresistive elements. The triaxial acceleration sensor using the piezoresistive elements includes a weight part, a flexible part connected to the weight part, a support part connected to the flexible part, and a plurality of piezoresistive elements arranged on the flexible part and detecting a displacement of the weight part in triaxial directions of XYZ. When an acceleration is applied to the sensor, the weight part is displaced, and the flexible part bends according to the displacement of the weight part. When the flexible part bends, the stress applied to the piezoresistive elements is changed, thereby changing the resistance values of the piezoresistive elements. By electrically detecting the changes of these resistance values, the acceleration applied to the acceleration sensor can be detected.

In general, as a package of the acceleration sensor, a ceramic package, a QFN Quad Flat None-Leaded) package, or a COB (Chip on Board) package is adopted. For example, Japanese Patent Laid-open No. 2007-322160 discloses an acceleration sensor element packaged with a case manufactured of alumina.

When a ceramic package is used, there is a problem such that a mold, a jig, a mask, and an original plate for screen printing are required to manufacture a package main body and a lid, thereby incurring increase in cost. Furthermore, when a control IC or the like is provided from a third party and a sensor is customized according to the provided control IC and packaged with the provided control IC, there is a problem such that there is a need to change the arrangement of a pin connect for connecting the control IC and the sensor and the design of the wiring pattern and others, thereby a package according to the product must be newly manufactured. In this case, a new mold and others suitable for the product are required, which causes an increase in manufacturing cost. Moreover, when a chip covered with a ceramic package is mounted on a substrate using an organic material (an organic substrate) such as a printed board, there is a problem such that, since the ceramic and the substrate have different coefficients of thermal expansion, reliability of a joint between the substrate and the package is decreased and reliability of the apparatus is also decreased. These problems occur also in the case as described in Japanese Patent Laid-open No. 2007-322160 in which alumina is used for packaging.

When any of a QFN package and a COB package is used, the entire components including the sensor, the control IC, and the substrate are required to be sealed with resin. Here, if the resin enters a space such as the weight part of the sensor, there is a problem such that the sensor does not function as a sensor, thereby decreasing reliability of the sensor. To address the problem, a barrier is required so as to prevent the resin from entering the sensor. However, there is a problem such that the number of processes for manufacturing increases in order to create the barrier and manufacturing cost increases accordingly. Also, in the case of the QFN package, as with the ceramic package, when a sensor is customized according to a control IC provided from a third party and packaged with the control IC, there is a problem such that there is a need to change the arrangement of a pin connect for connecting the control IC and the sensor and the design of the wiring pattern and others, thereby a package according to the product must be newly manufactured. As a result, the manufacturing cost increases. Still further, when the sensor is customized according to the control IC provided from the third party and packaged with the control IC, a relay substrate may be newly added to connect the control IC and the sensor. In this case, there is also a problem such that a package is required to be newly manufactured according to the arrangement of a pin connect of the relay substrate, thereby increasing manufacturing cost.

Still further, when any of the QFN package and the COB package is used, there is also a problem such that, when resin sealing is hardened, a stress is applied to the sensor in the sealing resin, thereby changing sensor characteristics. For example, when an acceleration sensor is used as a sensor, a change in offset voltage of the sensor changing according to the influence of the stress applied to the sensor at the time of sealing with resin is written in the control IC as a correction value. However, this correction range varies depending on the control IC. When the correction range of the control IC is narrow, a problem such that a shift in offset voltage due to the stress exceeds the correction range writable in the control IC and the sensor cannot function as a sensor.

SUMMARY

In view of the problems described above, the present invention discloses a sensor device and a manufacturing method thereof in which no resin seal is used when a sensor is packaged, in which a change in connection relation according to a change in specifications of a control IC and others is facilitated when the control IC is packaged together with the sensor and in which high reliability is kept.

A sensor device according to an embodiment of the present invention includes a substrate containing an organic material and being formed a wiring, a sensor arranged on the substrate and electrically connected to the wiring, and a package cap arranged on the substrate and containing an organic material covering the sensor, and the inside of the package cap is hollow.

A sensor device manufacturing method according to an embodiment of the present invention includes arranging a sensor on a substrate containing an organic material and being formed a wiring, electrically connecting the wiring and the sensor, and arranging a package cap containing an organic material on the substrate to cover the sensor for sealing.

A sensor device manufacturing method according to an embodiment of the present invention includes arranging a plurality of sensors on a substrate containing an organic material and being formed a wiring, electrically connecting the wiring and the plurality of sensors respectively, collectively arranging a plurality of package caps containing an organic material on the substrate so as to cover the plurality of sensors for sealing, and separating the plurality of sensors covered with the plurality of package caps respectively from each other.

According to the present invention, a sensor device and a manufacturing method thereof can be provided in which no resin seal is used when a sensor is packaged and, in which the change in connection relation according to the change in specifications of the control IC and others is facilitated when the control IC is packaged together with the sensor, and in which high reliability is kept.

BRIEF DESCRIPTION OF DRAWINGS

FIG. 3 is a process diagram for manufacturing the acceleration sensor device using the cavity substrate;

FIG. 4 is a process diagram for manufacturing the acceleration sensor device using the cavity substrate;

FIG. 5 is a process diagram for manufacturing the acceleration sensor device using the cavity substrate;

FIG. 8A is another sectional view of the entire structure of the acceleration sensor device;

DESCRIPTION OF EMBODIMENTS

With reference to the drawings, embodiments of the present invention are described in detail below. Note that in the embodiments described below, the case is mainly described in which a triaxial acceleration sensor using piezoresistive elements is used. However, the present invention is not restricted to the case of using the triaxial acceleration sensor using piezoresistive elements, can be applied to the case in which any of a capacitance-type sensor, various mechanical quantity sensors, and others having a displacing part moving according to an external force is used and, furthermore, can be variously modified.

First Embodiment

Figure 1A:
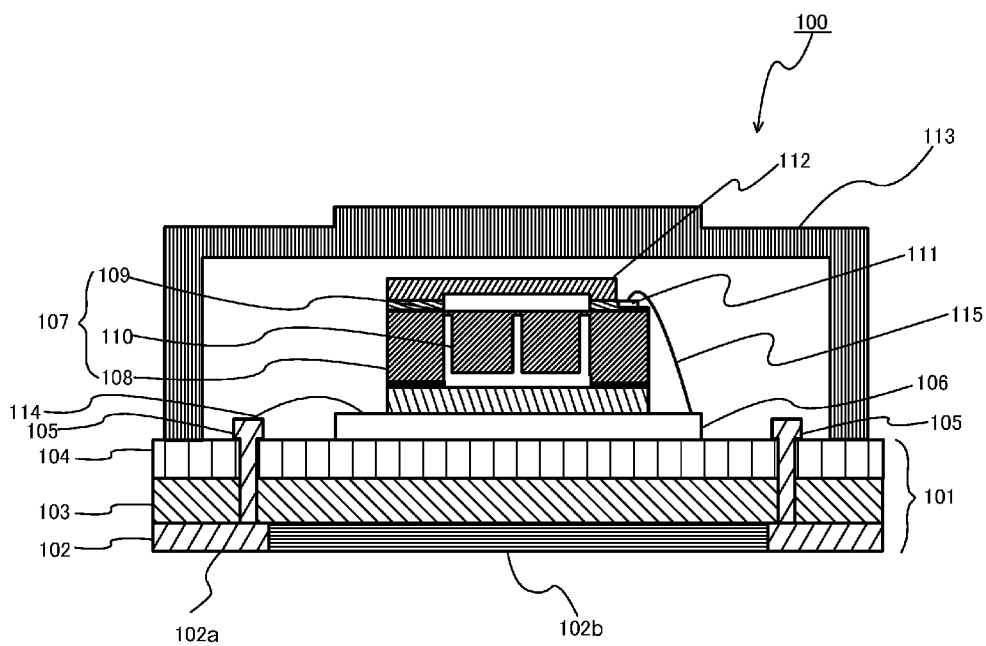
FIG. 1A is a sectional view showing the entire structure of an acceleration sensor device according to a first embodiment of the present invention when a normal substrate is used.
Figure 1B:
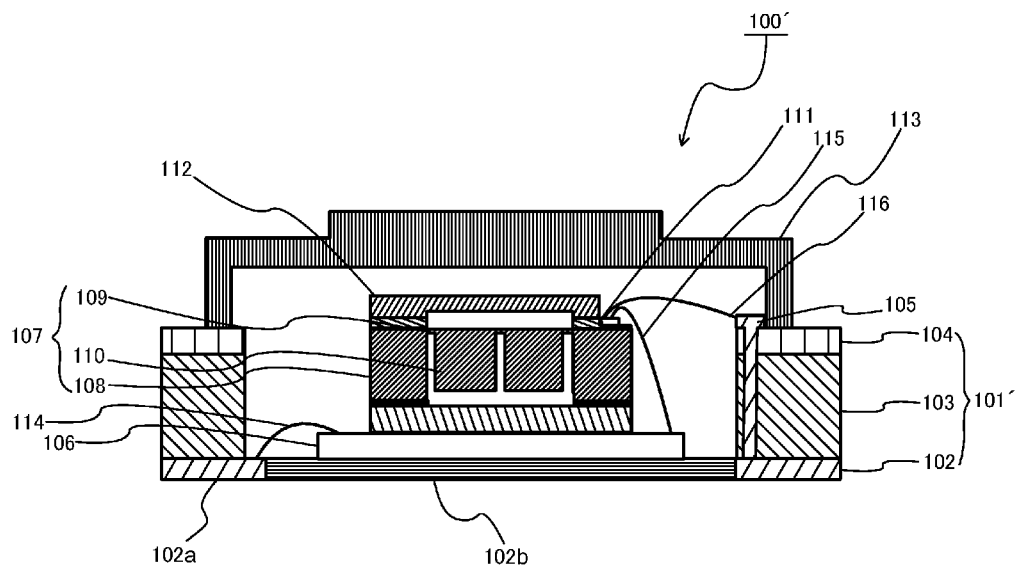
FIG. 1B is a sectional view showing the entire structure of the acceleration sensor device according to the first embodiment of the present invention when a cavity substrate is used.

FIG. 1A and FIG. 1B are sectional views each showing the entire structure of a sensor device according to a first embodiment of the present invention. While the case is described in the present embodiment in which a control IC is packaged together with an acceleration sensor, the present invention is not restricted to this, and only the sensor may be packaged. FIG. 1A is a sectional view of an acceleration sensor device 100 when a flat substrate (hereinafter referred to as a normal substrate) is used, and FIG. 1B is a sectional view of an acceleration sensor device 100' in which a substrate having a recessed space formed by etching the substrate in advance for accommodating a part or entire of the sensor and the control IC is used (hereinafter the substrate having the recessed space is referred to as a cavity substrate).

Note that while the term "control IC" is used in the specification, the IC is not used only for the purpose of controlling the sensor. For example, the control IC may process a signal transmitted from the sensor, such as amplifying a signal from the sensor. Also, the control IC may perform processes other than processing the signal transmitted from the sensor. Therefore, instead of "control IC", simply "IC" may be used.

With reference to FIG. 1A, the acceleration sensor device 100 using a normal substrate includes a substrate 101, a through electrode 105, a control IC 106, a sensor 107, wirings 114 and 115, a sensor upper cap (a control cap) 112, and a package cap 113.

The substrate 101 is a substrate containing an organic material and in which one or more wirings are formed. The substrate 101 is formed of three layers including a first substrate 102 having a portion 102a containing a conductive material and a portion 102b containing an insulating material, a second substrate 103 containing an insulating material and arranged on the first substrate 102, and a third substrate 104 containing an insulating material and arranged on the second substrate 103. The conductive material is a metal or the like, for example, copper, silver, gold, nickel, palladium, or the like may be used. As the insulating material, an insulating resin such as an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide, or others may be used. The resin described above may be used singly, or two or more types of resins may be used in combination. Furthermore, in addition to the resin described above, an inorganic filler such as glass, talc, mica, silica, or alumina may be used together. While an example is described in the present embodiment in which the substrate 101 is formed of three layers, the present invention is not restricted to this, and the substrate 101 may be formed of three or more or less layers.

Figure 10A:
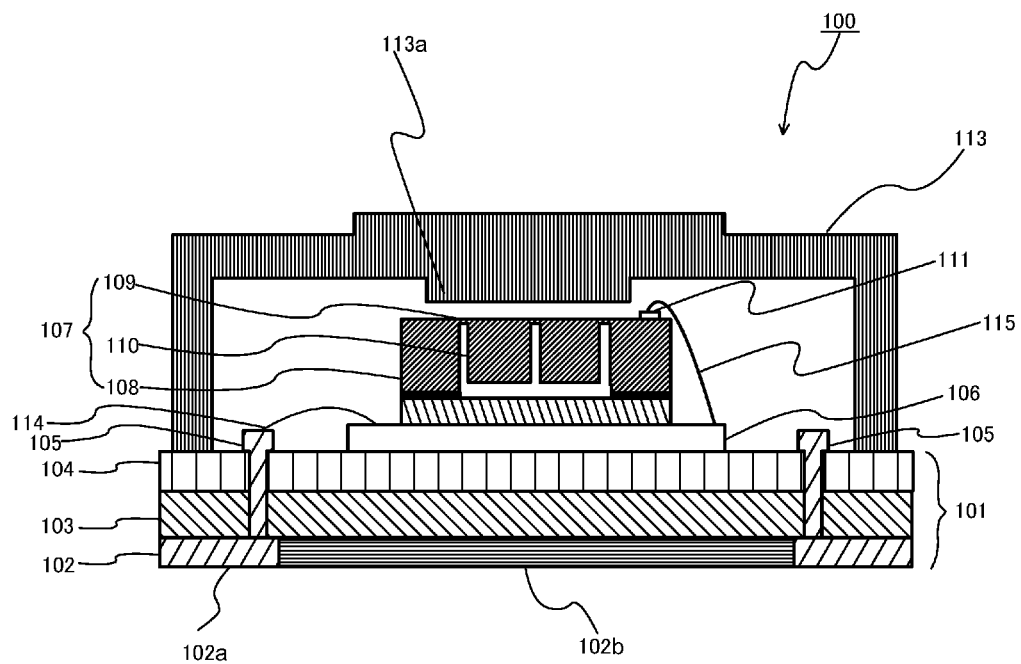
FIG. 10A is a sectional view showing the entire structure of the acceleration sensor device shown in FIG. 1A when a sensor upper cap is omitted.

The sensor 107 includes a weight part 110, a flexible part 109 connected to the weight part 110, a support part 108 connected to the flexible part 109, a plurality of piezoresistive elements (not shown) arranged on the flexible part 109 and detecting a displacement of the flexible part 109 in triaxial directions of XYZ, and an electrode 111. When an acceleration is applied to the sensor 107, the weight part 110 is displaced, and the flexible part 109 bends according to this displacement. When the flexible part 109 bends, a force is applied to the piezoresistive elements arranged on the flexible part 109, thereby changing the resistance values of the piezoresistive elements. By detecting the changes of these resistance values, the magnitude and direction of the acceleration applied to the sensor 107 are detected. A signal from the sensor 107 is transmitted from the electrode 111 through the wiring 115 to the control IC 106, and a signal from the control IC 106 is transmitted through the wiring 114, the through electrode 105, and others to the outside of the substrate 101. Note that the sensor upper cap 112 restricts an excessive displacement of the weight part 110 and the flexible part 109 in an upper direction to prevent breakage. The sensor upper cap 112 may be omitted and, when the sensor upper cap 112 is omitted, the package cap 113 may play the same role as that of the sensor upper cap 112. When the package cap 113 plays the same role as that of the sensor upper cap 112, as shown in FIG. 10A, a stopper 113a in a protruding shape may be formed on a portion of the package cap 113 corresponding to the sensor 107.

The package cap 113 of the acceleration sensor device 100 shown in FIG. 1A contains an organic material. An insulating resin such as an epoxy resin, an acrylic resin, or a polyimide resin may be used as the organic material. However, unlike a conventional QFN package and COB package, the sensor 107 is not sealed with the resin, and the package cap 113 has a hollow inside.

As described above, the sensor 107, the control IC 106, and the substrate 101 according to the present embodiment shown in FIG. 1A are covered with the package cap 113 containing an organic material to be packaged. And, the package cap 113 has the hollow inside. When a substrate containing an organic material is used as the substrate 101, the value of the coefficient of thermal expansion of the substrate 101 and the value of the coefficient of thermal expansion of the package cap 113 are close to each other, and therefore reliability of a joint between the substrate 101 and the package cap 113 is increased. The value of the coefficient of thermal expansion of the package cap 113 and the value of the coefficient of thermal expansion of the substrate 101 are approximately equal to each other, and a difference in coefficient of thermal expansion therebetween is within ±3 ppm. An adhesive agent bonding the substrate 101 and the package cap 113 together is preferably a resin having a value of a coefficient of thermal expansion close to the values of the coefficient of thermal expansion of the substrate 101 and the package cap 113. Also, a printed board may be used as the substrate 101, thereby allowing cost incurred in the change to be reduced more compared with the case of using a ceramic package or an alumina package when a connecting relation among wirings is changed according to a change of specifications of the control IC 106, that is, when designs such as the arrangement of a pin connect connecting the control IC 106 and the sensor 107 and the wiring pattern are changed. Furthermore, in the case of a ceramic package, there is a possibility that a crack may occur when the package itself is made thinner, thereby making it difficult to lower the height of the package. In the present embodiment, however, since the organic material, for example, the insulating resin, is used for the package cap 113 and the substrate 101, the package cap 113 and the substrate 101 have lighter weight and stronger resistance to a mechanical shock and vibration compared with a ceramic package and an alumina package. Therefore, the height of the acceleration sensor device 100 can be lowered. With this, for example, the acceleration sensor device 100 may be applied to a small terminal such as portable electronic equipment. Still further, unlike a QFN package and a COB package, the inside of the acceleration sensor device 100 according to the present embodiment is hollow without being sealed with the resin, eliminating the possibility that the resin may enter a space in the weight part 110 of the sensor 107. Still further, since the inside of the acceleration sensor device 100 is hollow without being sealed with the resin, no stress is applied to the sensor 107, eliminating the possibility that an offset value of the sensor 107 may be shifted. Therefore, reliability in performance of the acceleration sensor device 100 can be kept.

With reference to FIG. 1B, the acceleration sensor device 100' when a cavity substrate is used is described. Note that components identical or similar to those of the acceleration sensor device 100 using the normal substrate shown in FIG. 1A are provided with a same reference numeral, and are not redundantly described herein.

Figure 10B:
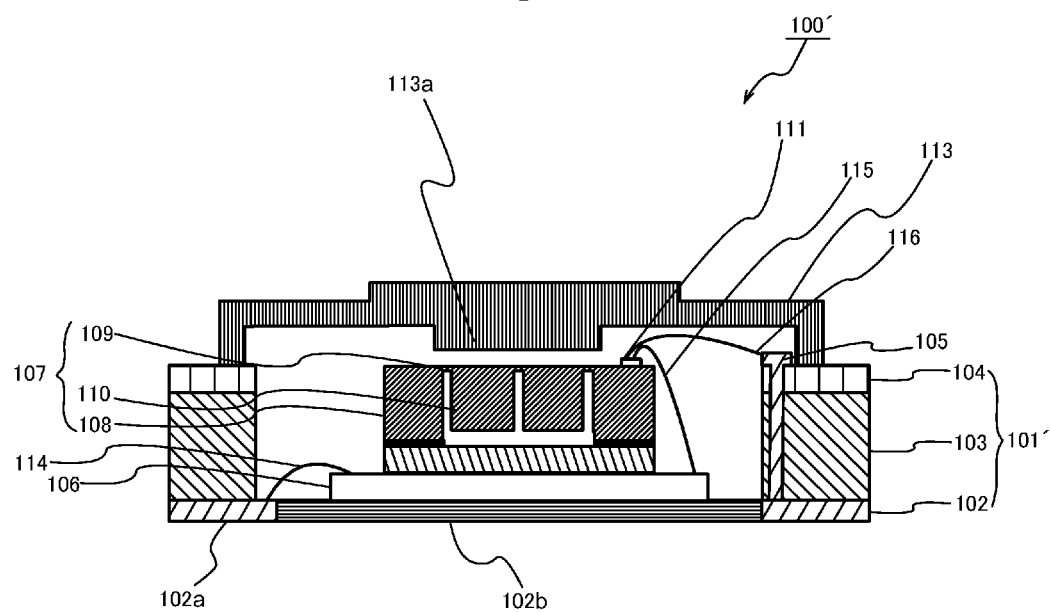
FIG. 10B is a sectional view showing the entire structure of the acceleration sensor device shown in FIG. 1B when a sensor upper cap is omitted.

With reference to FIG. 1B, the acceleration sensor device 100' when the cavity substrate is used includes, as with the acceleration sensor device 100 shown in FIG. 1A, a substrate 101' containing the organic material; the through electrode 105; the control IC 106; the sensor 107 including the weight part 110, the flexible part 109 connected to the weight part 110, the support part 108 connected to the flexible part 109, the plurality of piezoresistive elements (not shown) arranged on the flexible part 109 and detecting a displacement of the flexible part 109 in triaxial directions of XYZ, and the electrode 111; wirings 114, 115, and 116; the sensor upper cap 112; and the package cap 113 containing the organic material. Also, the substrate 101' is formed of three layers including the first substrate 102 having the portion 102a containing a conductive material and the portion 102b containing an insulating material, the second substrate 103 containing an insulating material, and the third substrate 104 containing an insulating material. However, the present invention is not restricted to this, and the substrate 101' may be formed of three or more or less layers. The conductive material or the insulating material used for the first substrate 102, the second substrate 103, and the third substrate 104 are similar to the conductive material or the insulating material used for the first substrate 102, the second substrate 103, and the third substrate 104 shown in FIG. 1A. Also, the sensor upper cap 112 may be omitted. When the sensor upper cap 112 is omitted, the package cap 113 may play the same role as that of the sensor upper cap 112. When the package cap 113 plays the same role as that of the sensor upper cap 112, as shown in FIG. 10B, the stopper 113a in a protruding shape may be formed on a portion of the package cap 113 corresponding to the sensor 107.

As shown in FIG. 1B, it is possible to lower the height of the overall acceleration sensor device 100' more in the case of using a substrate (a cavity substrate) having formed therein a recessed space (a cavity) that can accommodate a part or entire of the control IC 106 and the sensor 107 than in the case of using a normal substrate. The operation of the acceleration sensor device 100' using the cavity substrate 101' is identical to that of the acceleration sensor device 100 using the normal substrate 101 shown in FIG. 1A, and therefore is not described herein.

The sensor 107, the control IC 106, and the substrate 101' shown in FIG. 1B are covered with the package cap 113 containing the organic material, which is, for example, an insulating resin, to be packaged. And, the inside of the package cap 113 is hollow. With this, as with the acceleration sensor 100 shown in FIG. 1A, when a substrate containing the organic material is used as the substrate 101', the value of the coefficient of thermal expansion of the substrate 101' and the value of the coefficient of thermal expansion of the package cap 113 are close to each other, and therefore reliability of a joint between the substrate 101' and the package cap 113 is increased. The value of the coefficient of thermal expansion of the substrate 101' and the value of the coefficient of thermal expansion of the package cap 113 are approximately equal to each other, and a difference in coefficient of thermal expansion therebetween is within ±3 ppm. An adhesive agent bonding the substrate 101' and the package cap 113 together is preferably a resin having a value of a coefficient of thermal expansion close to the values of the coefficient of thermal expansion of the substrate 101' and the package cap 113. Also, a printed board may be used as the substrate 101', thereby allowing cost incurred in the change to be reduced more compared with the case of using a ceramic package or an alumina package when a connecting relation is changed according to a change of specifications of the control IC and others (that is, when designs such as the arrangement of a pin connect connecting the control IC 106 and the sensor 107 and the wiring pattern are changed). Furthermore, the package cap 113 and the substrate 101' each containing the organic material have a lighter weight and stronger resistance to a mechanical shock and vibration compared with a ceramic package, and therefore the occurrence of a crack can be reduced even if the package cap 113 is made thinner, and the height of the overall acceleration sensor device 100' can be lowered. Still further, unlike a QFN package and a COB package, the inside of the acceleration sensor device 100' according to the present embodiment is hollow without being sealed with the resin, eliminating the possibility that the resin may enter a space in the weight part of the sensor 107. Still further, since the inside of the acceleration sensor device 100' is hollow without being sealed with resin, no stress is applied to the sensor 107, eliminating the possibility that an offset value of the sensor 107 may be shifted. Therefore, reliability in performance of the acceleration sensor device 100' can be kept.

As shown in FIG. 1B, the recessed space (the cavity) for accommodating the sensor 107 is formed in the cavity substrate 101' by etching a substrate in advance. For this reason, the height of the overall acceleration sensor device 100' can be further lowered compared with that of the overall acceleration sensor device 100 using the normal substrate 100 shown in FIG. 1A. Furthermore, since the substrate is etched in advance to expose a lower layer of the first substrate 102, the first substrate 102 and the control IC 106 can be connected to each other with the wiring 114 not via the through electrode. The recessed part (the cavity) formed in the substrate preferably has a depth within 500 μm, particularly preferably from 100 μm to 500 μm. If the depth of the cavity is larger than 500 μm, a capillary interferes with the substrate or the sensor in a wire bonding process to decrease operability. Also, the cavity has a depth equal to or deeper than 100 μm, a height lowering effect can be expected, and operability in the wire bonding process can be kept.

Also as shown in FIG. 1B, the electrode 111 of the sensor 107 and the third substrate 104 are connected together with the wiring 116, and a wiring which connects connecting portion connecting to the wiring 116 and being arranged on the third substrate 104 and a connecting portion connecting to the wiring 114 and being arranged on the first substrate 102 via the through electrode 105 may be formed, thereby connecting the sensor 107 and the control IC 106. With this, the degree of flexibility of connection between the sensor 107 and the control IC 106 can be increased.

(Acceleration Sensor Device Manufacturing Method)

A method of manufacturing the acceleration sensor device 100' using the cavity substrate 101' shown in FIG. 1B is described with reference to FIG. 2 to FIG. 5. In FIG. 2 to FIG. 5, components identical or similar to those of the acceleration sensor device 100' when the cavity substrate 101' is used shown in FIG. 1B are provided with a same reference numeral, and are not redundantly described herein. While the case is described herein in which the control IC 106 is packaged together with the acceleration sensor 107, the present invention is not restricted to this, and only the sensor may be packaged.

Figure 2:
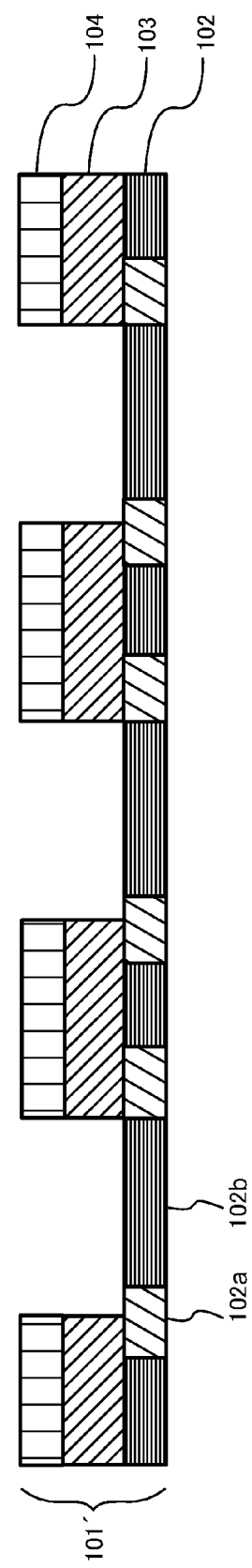
FIG. 2 is a process diagram for manufacturing the acceleration sensor device using a cavity substrate.

First, the sensor 107, the substrate 101' including the first substrate 102, the second substrate 103, and the third substrate 104, the control IC 106, and the package cap 113 as shown in FIG. 1B are manufactured in advance. When the substrate 101' is manufactured, the substrate 101' is etched by using a laser or the like to form a cavity. Note that a plurality of cavities may be formed in the substrate 101' as shown in FIG. 2. As a matter of course, one cavity may be formed in one substrate 101'.

Next, as shown in FIG. 3, the control ICs 106 and the sensors 107 are arranged and bonded in the cavities of the substrate 101' by die attach (die bonding) or the like. Next, as shown in FIG. 4, the substrate 101', each of the control ICs 106 and each of the sensor s107 are electrically connected to each other with wirings 114, 115, and 116, and the through electrode (not shown, refer to 105 in FIG. 1B) by wire bonding or the like. Next, as shown in FIG. 5, the package cap 113 set in a mold 501 is bonded onto the substrate 101' so as to cover the sensor 107 for sealing. Then, the mold 501 in which the package cap 113 is set is removed. And then, the substrate 101' is subjected to dicing to separate individual acceleration sensor devices from each other into pieces. With these processes, the acceleration sensor device 100' is obtained.

Note that the package cap 113 contains the organic material, and may be formed of, for example, the insulating resin. The plurality of package caps 113 may be formed on one side of the mold 501, which is a flat plate made of a metal (copper, for example) having a plurality of openings, each as being set so as to partially fit in the opening. The package cap 113 may be bonded to the third substrate 104 by applying the adhesive agent to the package caps 113 which are respectively set in the openings of the mole 501, arranging the package caps 113 on an upper surface of the substrate 101' in FIG. 4 for surface mounting, heating and pressurizing them. The adhesive agent which is used herein is preferably a resin having a value of a coefficient of thermal expansion close to the values of the coefficient of thermal expansion of the substrate 101' and the package cap 113. Then, the mold 501 may be removed.

On the other hand, in the case of a ceramic package, it is required to separately package devices one by one when the substrate, the control IC, and the sensor are packaged. However, in the case of a resin package, surface mounting can be performed as described above, allowing a plurality of devices to be collectively packaged. For this reason, the manufacturing process can be shortened. Furthermore, when a sensor is customized according to the control IC and packaged with the control IC, designs such as the arrangement of a pin connect connecting the control IC and the sensor and wiring pattern are required to be changed. In the case of a ceramic package or an alumina package, a package suitable for the product must be newly manufactured, thereby incurring increase in cost. In an embodiment of the present invention, a printed board is be used as the substrate, and therefore a change and a customizing according to the control IC can be easily made. Still further, a hollow (a space) is present between the package cap 113 and the substrate 101', the control IC 106, and the sensor 107. That is, the substrate 101', the control IC 106, and the sensor 107 are not sealed with resin. Therefore, a barrier for preventing resin from flowing into the sensor 107 is not required. Therefore, the manufacturing process can be further shortened.

While the method of manufacturing the acceleration sensor device 100' using the cavity substrate shown in FIG. 1B has been described with reference to FIG. 2 to FIG. 5, a method of manufacturing the acceleration sensor device 100 shown in FIG. 1A is approximately the same. However, since the normal substrate is used in the acceleration sensor device 100 described in FIG. 1A, the substrate 101 that is flat with no accommodation space for a sensor is prepared.

While the method of manufacturing the acceleration sensor device 100' using the cavity substrate shown in FIG. 1B has been described herein, the present invention is not restricted to this, and may be changed as appropriate according to the mounting method, arrangement, and others of each device.

Second Embodiment

Figure 6A:
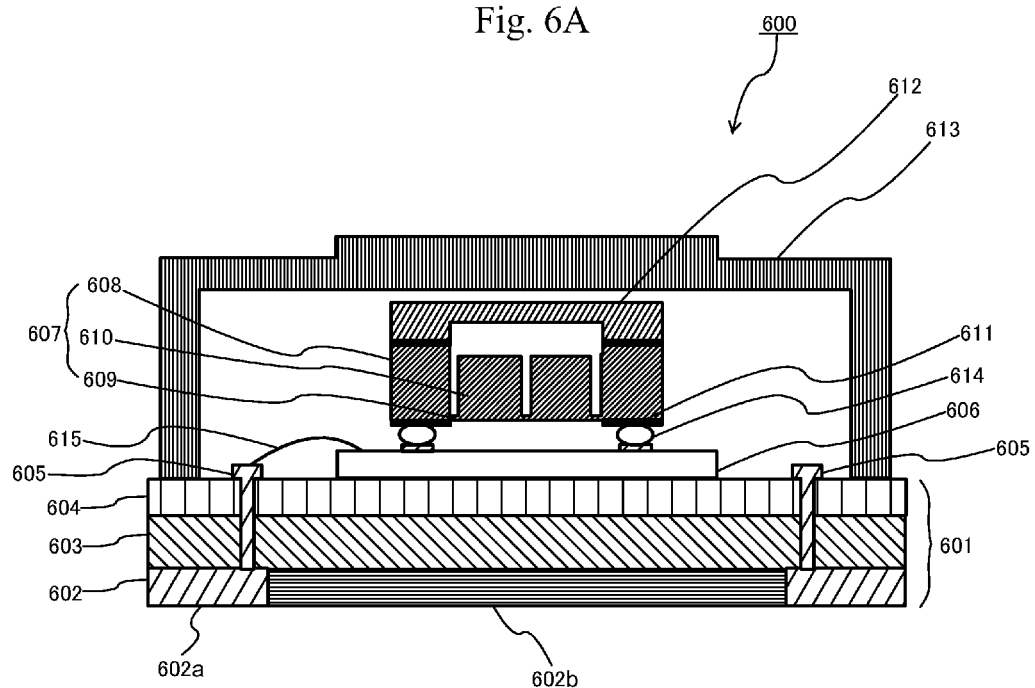
FIG. 6A is a sectional view showing the entire structure of a flip-chip-mounted acceleration sensor device according to a second embodiment of the present invention when a normal substrate is used.
Figure 6B:
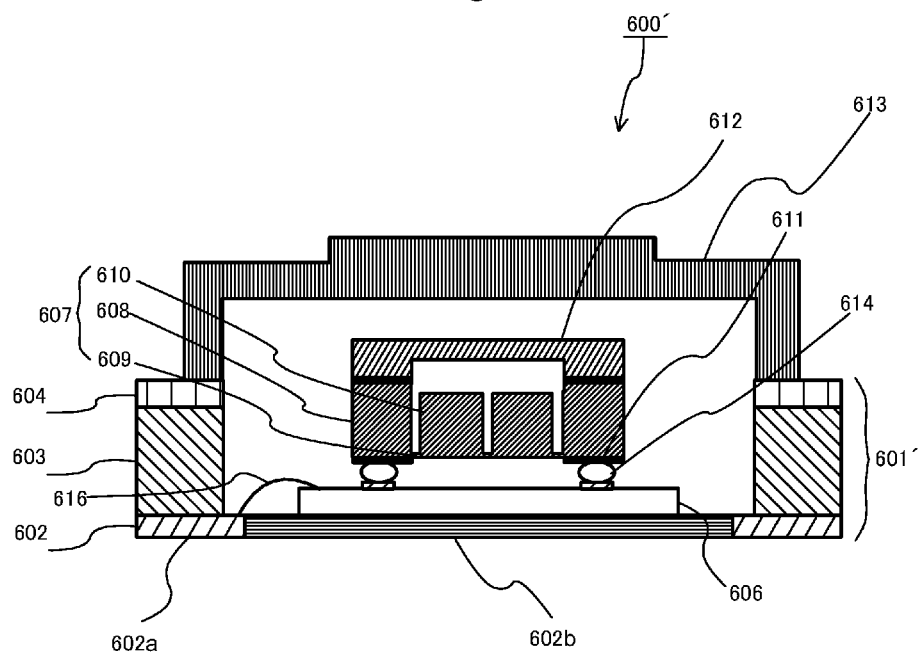
FIG. 6B is a sectional view showing the entire structure of the flip-chip-mounted acceleration sensor device according to the second embodiment of the present invention when a cavity substrate is used.

An acceleration sensor device according to a second embodiment of the present invention is described next with reference to FIG. 6A and FIG. 6B. While the case is described in the present embodiment in which a control IC is packaged together with the acceleration sensor, the present invention is not restricted to this, and only the sensor may be packaged. FIG. 6A and FIG. 6B are sectional views showing the entire structure of the acceleration sensor device according to the second embodiment of the present invention. FIG. 6A is a sectional view of a flip-chip-mounted acceleration sensor device 600 when a normal substrate is used, and FIG. 6B is a sectional view of a flip-chip-mounted acceleration sensor device 600' when a cavity substrate obtained by etching a substrate in advance to form a recessed space for accommodating a part or entire of the sensor and the control IC is used.

With reference to FIG. 6A, the acceleration sensor device 600 using the normal substrate includes a substrate 601, a control IC 606, a sensor 607, an electrode 611, a sensor upper cap 612, a package cap 613, a bump 614, and a wiring 615.

The substrate 601 is a substrate containing an organic material and in which one or more wirings are formed. The substrate 601 is formed of, for example, three layers including a first substrate 602 having a portion 602a containing a conductive material and a portion 602b containing an insulating material, a second substrate 603 containing an insulating material and arranged on the first substrate 602, and a third substrate 604 containing an insulating material and arranged on the second substrate 603. The conductive material or the insulating material contained in the first substrate 602, the second substrate 603, and the third substrate 604 are similar to those described in the first embodiment. In the present embodiment, an example of the substrate 601 formed of three layers is described. However, the present invention is not restricted to this, the substrate 601 may be formed of three or more or less layers.

Figure 11A:
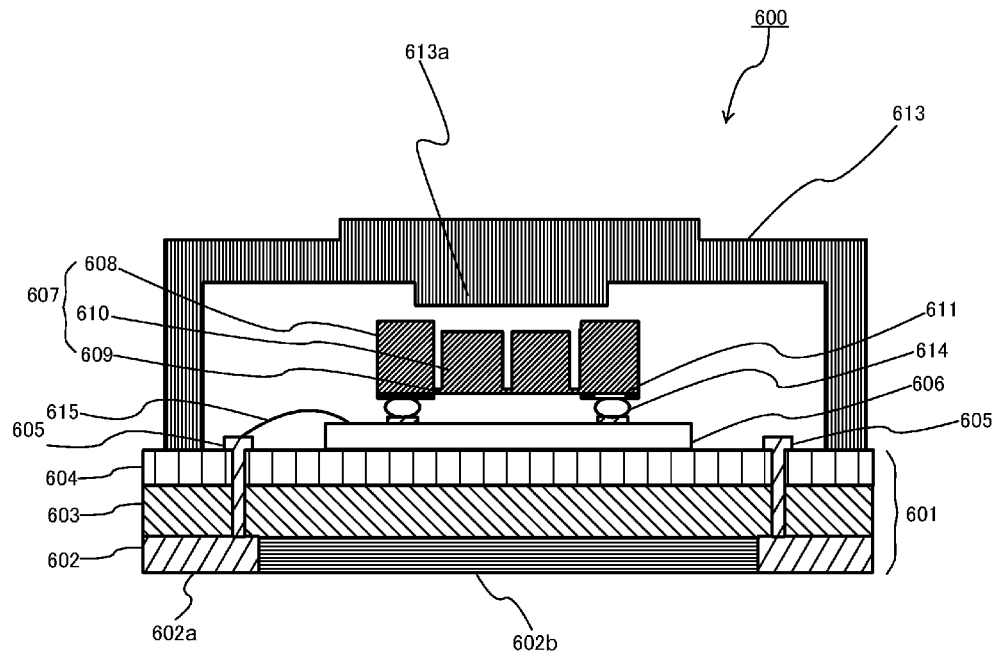
FIG. 11A is a sectional view showing the entire structure of the acceleration sensor device shown in FIG. 6A when a sensor upper cap is omitted.

The sensor 607 includes a weight part 610, a flexible part 609 connected to the weight part 610, a support part 608 connected to the flexible part 609, a plurality of piezoresistive elements (not shown) arranged on the flexible part 609 and detecting a displacement of the flexible part 609 in triaxial directions of XYZ, and the electrode 611. As with the acceleration sensor described in the first embodiment, when an acceleration is applied to the sensor 607, the weight part 610 is displaced, and the flexible part 609 bends according to this displacement. When the flexible part 609 bends, a force is applied to the piezoresistive elements arranged on the flexible part 609, thereby changing the resistance values of the piezoresistive elements. By detecting the changes of these resistance values, the magnitude and direction of the acceleration applied to the acceleration sensor device 600 are detected. A signal from the sensor 607 is transmitted from the electrode 611 to the control IC 606, and a signal from the control IC 606 is transmitted through the wiring 615 and the through electrode 605 to the substrate 601. The sensor upper cap 612 restricts an excessive displacement of the weight part 610 and the flexible part 609 in an upper direction to prevent breakage. However, the sensor upper cap 612 may be omitted and, in that case, the package cap 613 may play the same role as that of the sensor upper cap 612. When the package cap 613 plays the same role as that of the sensor upper cap 612, as shown in FIG. 11A, a stopper 613a may be formed on a portion of the package cap 613 corresponding to the sensor 607. The stopper 613a may have a protruding shape, but is not restricted to this. Also, when the package cap 613 plays the same role as that of the sensor upper cap 612, the height of the package cap 613 may be lowered by bring the portion of the package cap 613 corresponding to the sensor 607 closer to a movable part of the sensor.

As shown in FIG. 6A, in the acceleration sensor device 600, the sensor 607 and the control IC 606 are flip-chip-mounted, and are connected via the bump 614. For this reason, a wiring for connecting the sensor 607 and the control IC 606 is not required. Because the wiring is not used for connecting the sensor 607 and the control IC 606, the mount area can be decreased, and the size of the entire acceleration sensor devise 600 can further be decreased.

The package cap 613 of the acceleration sensor device 600 shown in FIG. 6A contains an organic material and, for example, an insulating resin is used. The inside of the package cap 613 is not sealed with resin and is hollow. When a substrate containing an organic material is used as the substrate 601, the value of the coefficient of thermal expansion of the substrate 601 and the value of the coefficient of thermal expansion of the package cap 613 are close to each other, and therefore reliability of a joint between the substrate 601 and the package cap 613 is increased. The value of the coefficient of thermal expansion of the substrate 601 and the value of the coefficient of thermal expansion of the package cap 613 are approximately equal to each other, and a difference in coefficient of thermal expansion therebetween is within ±3 ppm. An adhesive agent bonding the substrate 601 and the package cap 613 together is preferably a resin having a value of a coefficient of thermal expansion close to the values of the coefficient of thermal expansion of the substrate 601 and the package cap 613. Also, a printed board may be used as the substrate 601, thereby allowing manufacturing cost to be reduced compared with the case of using a ceramic package or an alumina package when a connecting relation among wirings is changed according to a change of specifications of the control IC 606 (that is, when designs such as the arrangement of a pin connect connecting the control IC 606 and the sensor 607 and the wiring pattern are changed). Furthermore, by using the organic material, for example, the insulating resin, for the package cap 613 and the substrate 601, resistance to a mechanical shock and vibration is increased, and therefore the height of the acceleration sensor device 600 itself can be lowered. Also, the inside of the acceleration sensor device 600 is hollow, thereby eliminating the possibility that resin may enter a space between the sensor 607 and the control IC 606. Still further, since the inside of the acceleration sensor device 600 is hollow without being sealed with resin, no stress is applied to the sensor 607, eliminating the possibility that an offset value of the sensor 607 may be shifted. Therefore, reliability in performance of the acceleration sensor device 600 can be kept.

FIG. 6B shows a flip-chip-mounted acceleration sensor device 600' when the cavity substrate is used. When the cavity substrate having a space for accommodating a sensor is used, in general, the entire package can be made thinner compared with the case of using the normal substrate. Components identical or similar to those of the acceleration sensor device 600 using the normal substrate shown in FIG. 6A are provided with a same reference numeral, and are not redundantly described herein.

Figure 11B:
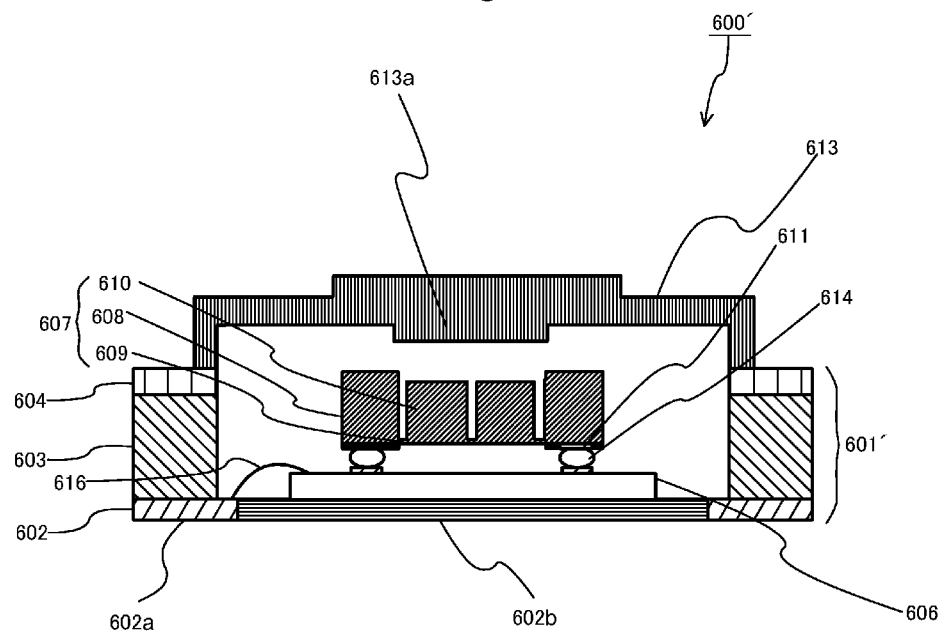
FIG. 11B is a sectional view showing the entire structure of the acceleration sensor device shown in FIG. 6B when a sensor upper cap is omitted.

With reference to FIG. 6B, the flip-chip-mounted acceleration sensor device 600' using the cavity substrate includes, as with the acceleration sensor device 600 shown in FIG. 6A, a substrate 601' containing an organic material; the control IC 606; the sensor 607 including the weight part 610, the flexible part 609 connected to the weight part 610, the support part 608 connected to the flexible part 609, the plurality of piezoresistive elements (not shown) arranged on the flexible part 609 and detecting a displacement of the flexible part 609 in triaxial directions of XYZ, and the electrode 611; the sensor upper cap 612; the package cap 613 containing an organic material; the bump 614; and the wiring 615. The substrate 601' is formed of three layers including the first substrate 602 having a portion 602*a* containing a conductive material and a portion 602*b* containing an insulating material, the second substrate 603 containing an insulating material, and the third substrate 604 containing an insulating material. However, the present invention is not restricted to this, and the substrate 601' may be formed of three or more or less layers. The conductive material or the insulating material used for the first substrate 602, the second substrate 603, and the third substrate 604 are similar to the conductive material or the insulating material used for the first substrate 602, the second substrate 603, and the third substrate 604 shown in FIG. 6A. Also, the sensor upper cap 612 may be omitted. In that case, the package cap 613 may play the same role as that of the sensor upper cap 612. When the package cap 613 plays the same role as that of the sensor upper cap 612, as shown in FIG. 11B, the stopper 613*a* may be formed on a portion of the package cap 613 corresponding to the sensor 607. The stopper 613*a* may have a protruding shape, but is not restricted to this. Also, when the package cap 613 plays the same role as that of the sensor upper cap 612, the height of the package cap 613 may be lowered by bring the portion of the package cap 613 corresponding to the sensor 607 closer to a movable part of the sensor. The operation of the acceleration sensor device 600' using the cavity substrate 601' is identical to the operation of the acceleration sensor device 600 using the normal substrate 601 shown in FIG. 6A, and therefore is not described herein.

As with the package cap 613 of the acceleration sensor device 600 shown in FIG. 6A, the package cap 613 of the acceleration sensor device 600' shown in FIG. 6B contains the organic material and, for example, the insulating resin is used. The inside of the package cap 613 is not sealed with resin and is hollow. When a substrate containing an organic material is used as the substrate 601', the value of the coefficient of thermal expansion of the substrate 601' and the value of the coefficient of thermal expansion of the package cap 613 are close to each other, and therefore reliability of a joint between the substrate 601' and the package cap 613 is increased. The value of the coefficient of thermal expansion of the substrate 601' and the value of the coefficient of thermal expansion of the package cap 613 are approximately equal to each other, and a difference in coefficient of thermal expansion therebetween is within ±3 ppm. An adhesive agent bonding the substrate 601' and the package cap 613 together is preferably a resin having a value of a coefficient of thermal expansion close to the values of the coefficient of thermal expansion of the substrate 601' and the package cap 613. Also, a printed board may be used as the substrate 601', thereby allowing manufacturing cost to be reduced compared with the case of using a ceramic package or an alumina package when a connecting relation among wirings is changed according to the control IC 606 (that is, when designs such as the arrangement of a pin connect connecting the control IC 606 and the sensor 607 and the wiring pattern are changed). Furthermore, by using the organic material for the package cap 613 and the substrate 601', resistance to a mechanical shock and vibration is increased, and therefore the height of the acceleration sensor 600' itself can be lowered. Also, the inside of the acceleration sensor device 600' is hollow, thereby eliminating the possibility that resin may enter a space between the sensor 607 and the control IC 606. Still further, since the inside of the acceleration sensor device 600' is hollow without being sealed with resin, no stress is applied to the sensor 607, eliminating the possibility that an offset value of the sensor 607 may be shifted. Therefore, reliability in performance of the acceleration sensor device 600' can be kept.

Still further, as with the acceleration sensor device 600 shown in FIG. 6A, the sensor 607 and the control IC 606 of the acceleration sensor device 600' are flip-chip-mounted, and are connected via the bump 614. Since a wiring for connecting the sensor 607 and the control IC 606 is not required, the mount area can be decreased, and the size of the entire acceleration sensor devise 600' can further be decreased. In the cavity substrate 601', a recessed space (a cavity) for accommodating the sensor 607 is formed by etching the substrate in advance. Therefore, the height of the acceleration sensor device 600' can be further lowered compared with the acceleration sensor device 600 using the normal substrate 601 shown in FIG. 6A. The recessed part (the cavity) formed in the substrate 601' preferably has a depth within 500 μm, particularly preferably from 100 μm to 500 μm. If the depth of the cavity is larger than 500 μm, a capillary interferes with a substrate or the sensor in a wire bonding process to decrease operability. Also, the cavity has a depth equal to or deeper than 100 μm, a height lowering effect can be expected, and operability in the wire bonding process can be kept.

Figure 7:
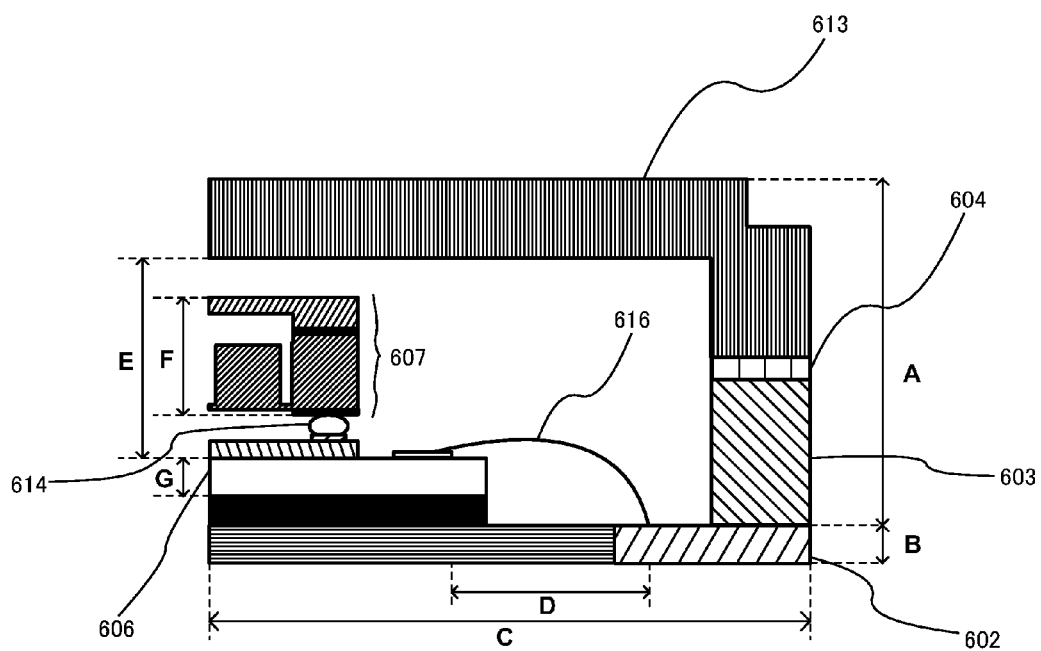
FIG. 7 is a diagram of an example of dimensions of a package of the acceleration sensor device.

An example of dimensions of the components in an acceleration sensor device of the present invention is described with reference to FIG. 7. FIG. 7 is a partial sectional view of a flip-chip-mounted acceleration sensor device when a cavity substrate is used. Components similar to those of the flip-chip-mounted acceleration sensor device 600' shown in FIG. 6B are provided with the same reference numeral in FIG. 6B With reference to FIG. 7, for example, dimensions may be designed so that A is 1.15 mm, B is 0.1 mm, C is 1.6 mm, D is 0.17 mm, E is 0.7 mm, F is 0.5 mm, and G is 0.1 mm. However, these dimensions are merely an example, and the present invention is not restricted to these dimensions. Each of these dimensions may be changed according to the size of the acceleration sensor device.

Third Embodiment

An acceleration sensor device according to a third embodiment of the present invention is described next with reference to FIG. 12 and FIG. 14. While the case is described in the present embodiment in which a control IC is packaged together with the acceleration sensor, the present invention is not restricted to this, and only the sensor may be packaged. The acceleration sensor device according to the third embodiment has a structure similar to that of the acceleration sensor device 100' according to the first embodiment except for the first substrate of a cavity substrate. Therefore, components similar to or analogous to those of the acceleration sensor device 100' shown in FIG. 1B are provided with a same reference numeral, and are not redundantly described herein.

Figure 12:
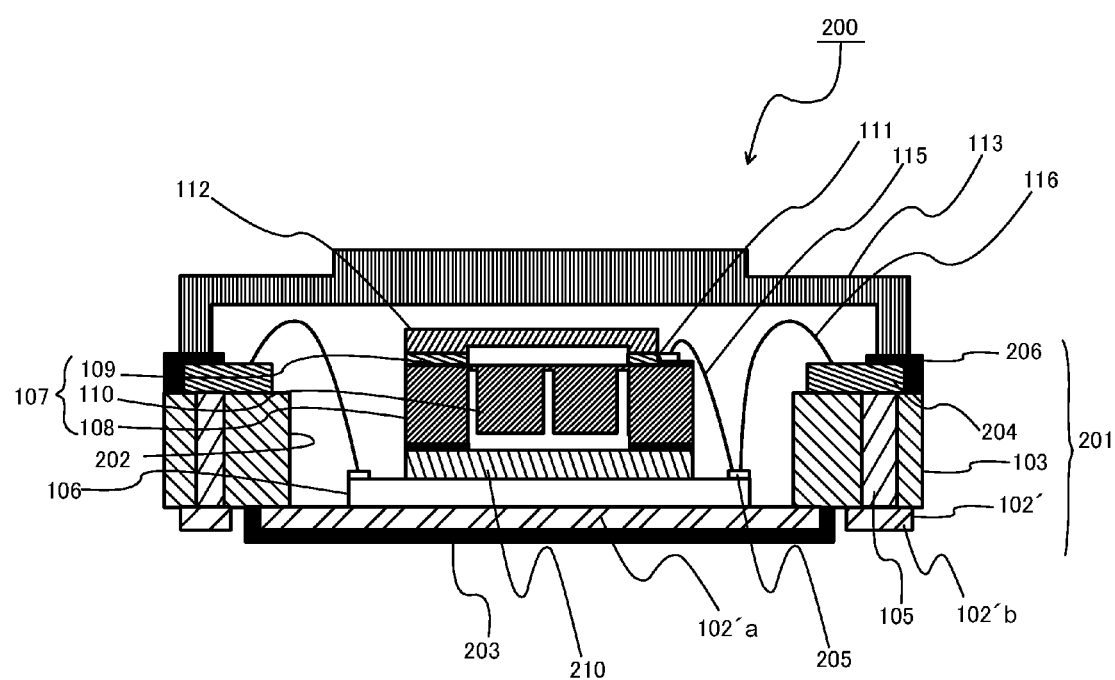
FIG. 12 is a sectional view showing the entire structure of an acceleration sensor device according to a third embodiment of the present invention when a cavity substrate is used.

FIG. 12 is a sectional view showing the entire structure of the acceleration sensor device 200 according to the third embodiment of the present invention. The acceleration sensor device 200 is used a multilayered substrate 201 in which a cavity is formed for accommodating the control IC 106 and the sensor 107. In the multilayered substrate 201, a first substrate 102 formed of a metal is arranged on a lowermost layer of the multilayered substrate 201. The acceleration sensor device 200 according to the third embodiment shown in FIG. 12 has a structure similar to that of the acceleration sensor device 100' according to the first embodiment except for the multilayered substrate 201 used in the acceleration sensor device 200.

With reference to FIG. 12, the acceleration sensor device 200 includes the multilayered substrate 201, the control IC 106, the sensor 107, the electrode 111, the sensor upper cap 112, a sensor lower cap 210, the package cap 113, an electrode 205, the wiring 115, and the wiring 116. The multilayered substrate 201 is a cavity substrate in which a recessed accommodation space (the cavity) 202 is formed, and the inside of the acceleration sensor device 200 is hollow.

The multilayered substrate 201 is formed of five layers including the first substrate 102', which is a metal substrate, the second substrate 103 arranged on the first substrate 102 and containing an insulating material, a third substrate 204 arranged on the second substrate 103 and containing a conductive material, an insulating layer 203 covering part of the first substrate 102', and a insulating layer 206 covering part of the third substrate 204. The conductive material contained in the third substrate 204 may be a metal such as copper, silver, gold, nickel, palladium, or the like. As the insulating material contained in the second substrate 103, an insulating resin, such as an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide, or others may be used. The resin may be used singly, or two or more types of resins may be used in combination. Furthermore, in addition to the resin, an inorganic filler such as glass, talc, mica, silica, or alumina may be used together. In the present embodiment, an example is described in which the multilayered substrate 201 includes the first substrate 102' and the third substrate 204 which are metal layers. However, the present invention is not restricted to this, and the substrate 201 may be formed of five or less layers including the two metal layers, or five or more layers including the two metal layers. The multilayered substrate 201 may have one or more wirings. As described above, the recessed part (the cavity) 202 for accommodating the control IC 106 and the sensor 107 is formed in the multilayered substrate 201 by etching, laser processing, or the like. In FIG. 12, the second substrate 103 has been completely subjected to cavity processing, and the third substrate 204 has been patterned. In the acceleration sensor device 200 according to the third embodiment of the present invention shown in FIG. 12, the recessed part (the cavity) 202 is formed with the first substrate 102' being taken as a bottom. The first substrate 102' has been patterned, and a first substrate 102'a arranged corresponding to the recessed part (cavity) 202 is covered with the insulating layer 203 in the multilayered substrate 201. The first substrate 102' contains a metal which has excellent thermal conductivity, for example, a copper, although this is not restrictive. The first substrate 102' preferably has a thickness of 15 μm to 80 μm in consideration of the strength of the acceleration sensor device 200. The control IC 106 is arranged and bonded with a adhesive agent on the first substrate 102'a arranged corresponding to the recessed part (cavity) 202 formed in the multilayered substrate 201. The third substrate 204 and a first substrate 102'b not corresponding to the recessed part 202 formed in the multilayered substrate 201 may function as an electrode pad or a pad for external connection.

The insulating layer 203 contains an insulating resin such as an organic material, for example, an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide, or others may be used. The resin may be used singly, or two or more types of resins may be used in combination. Furthermore, in addition to the resin, an inorganic filler such as glass, talc, mica, silica, or alumina may be used together.

The sensor 107 includes the weight part 110, the flexible part 109 connected to the weight part 110, the support part 108 connected to the flexible part 109, the plurality of piezoresistive elements (not shown) arranged on the flexible part 109 and detecting a displacement of the flexible part 109 in triaxial directions of XYZ, and the electrode 111. As with the acceleration sensor described in the first embodiment, when an acceleration is applied to the sensor 107, the weight part 110 is displaced, and the flexible part 109 bends according to this displacement. When the flexible part 109 bends, a force is applied to the piezoresistive elements arranged on the flexible part 109, thereby changing the resistance values of the piezoresistive elements. By detecting the changes of these resistance values, the magnitude and direction of the acceleration applied to the acceleration sensor device 200 are detected. A signal from the sensor 107 is transmitted from the electrode 111 through the wiring 115 to the control IC 106, and a signal from the control IC 106 is transmitted through the electrode 205, the wiring 116, the third substrate 204, the through electrode 105, and the first substrate 102'b to the outside. Each wiring and each electrode are potted with an insulating resin. The sensor upper cap 112 restricts an excessive displacement of the weight part 110 and the flexible part 109 in an upper direction to prevent breakage. The sensor lower cap 210 keeps a hermetic state in the sensor 107, and restricts an excessive movement of the weight part 110 in a lower direction. However, the sensor upper cap 112 and the sensor lower cap 210 may be omitted. When the sensor upper cap 112 is omitted, as shown in FIG. 10B, a stopper in a protruding shape may be provided to a portion of the package cap 113 corresponding to the sensor 107, and the package cap 113 may play the same role as that of the sensor upper cap 112. Also, the control IC 106 may play the same role as that of the sensor lower cap 210 when the sensor lower cap 210 is omitted.

The insulating layer 206 is arranged as a cover layer between the third substrate 204 and the package cap 113. The insulating layer 206 contains an insulating resin of an organic material such as an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide, or others may be used. The resin may be used singly, or two or more types of resins may be used in combination. Furthermore, in addition to the resin, an inorganic filler such as glass, talc, mica, silica, or alumina may be used together.

Figure 13:
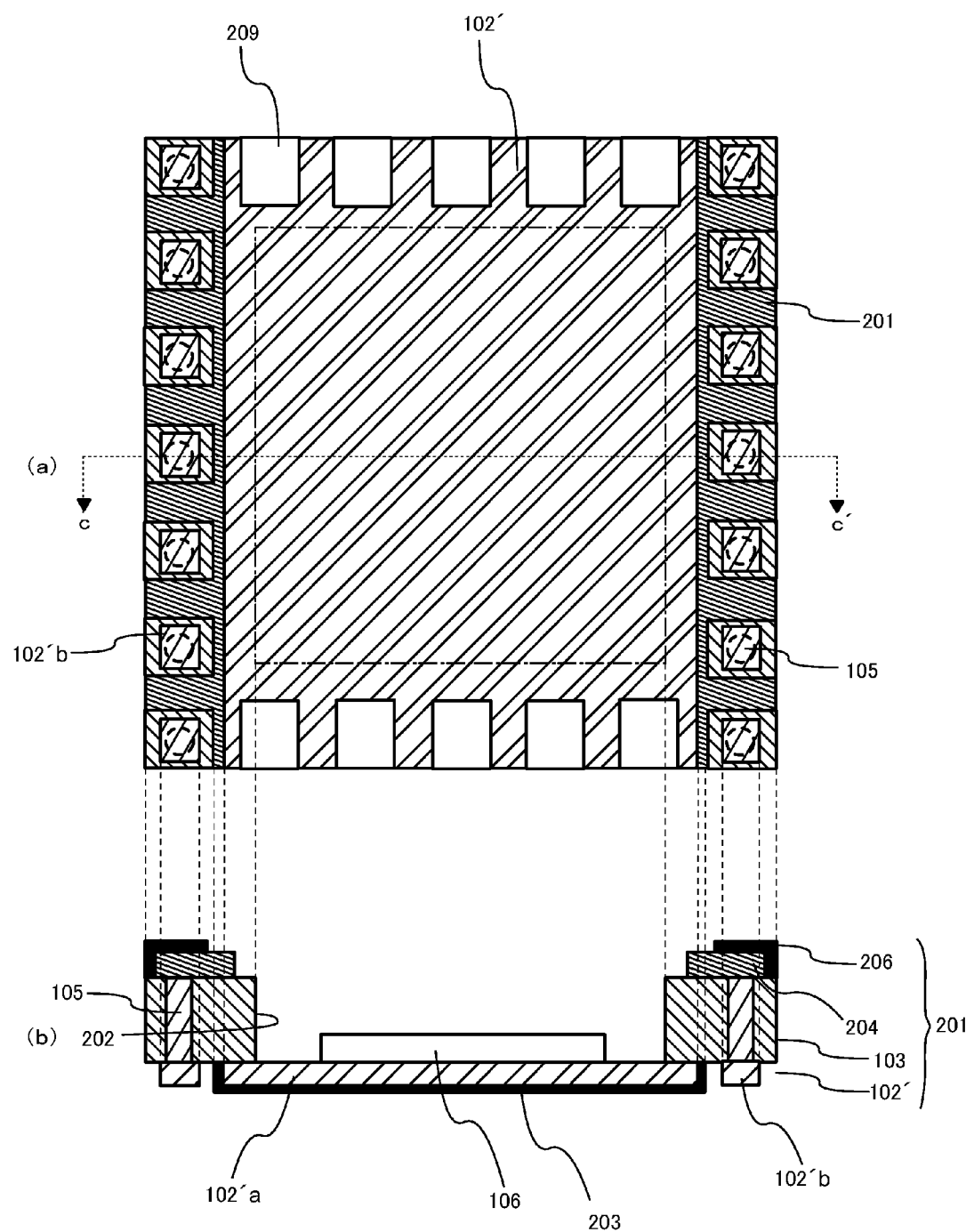
FIG. 13 (a) is a plan view in which a package of the acceleration sensor device 200 described in FIG. 12 is partially viewed through a back surface and FIG. 13 (b) is a sectional view along c-c' in FIG. 13 (a)

FIG. 13 (a) is a plan view in which the acceleration sensor device 200 shown in FIG. 12 is viewed through a lower surface, and FIG. 13 (b) is a sectional view viewed along a c-c' line in FIG. 13 (a). Note that in Fig. (a) and (b), the components of the acceleration sensor device 200 other than the insulating layer 203, the first substrate 102', the second substrate 103, the third substrate 204, the recessed part (the cavity) 202, the control IC 106, the through electrode 105, and the insulating layer 206 is not shown. A dummy pad 209 is arranged on the surface of the insulating layer 203, but the dummy pad 209 may be omitted. As is obvious from FIGS. 13 (a) and (b), the control IC 106 is directly arranged on the first substrate 102'.

As shown in FIG. 12, since a part or entire of the control IC 106 and the sensor 107 is accommodated in the recessed part (the cavity) 202 formed in the multilayered substrate 201, the height of the entire acceleration sensor device 200 can also be lowered. Furthermore, since the first substrate 102', which is the metal substrate, is used for the multilayered substrate 201, even if the cavity formed in the multilayered substrate 201 is deep, the strength of the entire the acceleration sensor device 200 is improved, and warping is decreased. Also, the control IC 106 is arranged and mounted on the first substrate 102' with the adhesive agent as described above. For example, when the first substrate 102' contains copper, a stress can be reduced in a hot environment and a cool environment since the coefficient of thermal expansion of copper is 17.5 ppm/° C., and is closer to the coefficient of thermal expansion of silicon (3.3 ppm/° C.) used in the control IC 106 rather than the coefficient of thermal expansion of a resin (approximately 20 ppm/° C.). Furthermore, since the first substrate 102' is a metal substrate having a thermal conductivity higher than the insulating material used in a portion denoted as 102b of the first substrate 102 described in the first embodiment, and therefore has an effect of releasing heat from the control IC 106 and the sensor 107.

Figure 14:
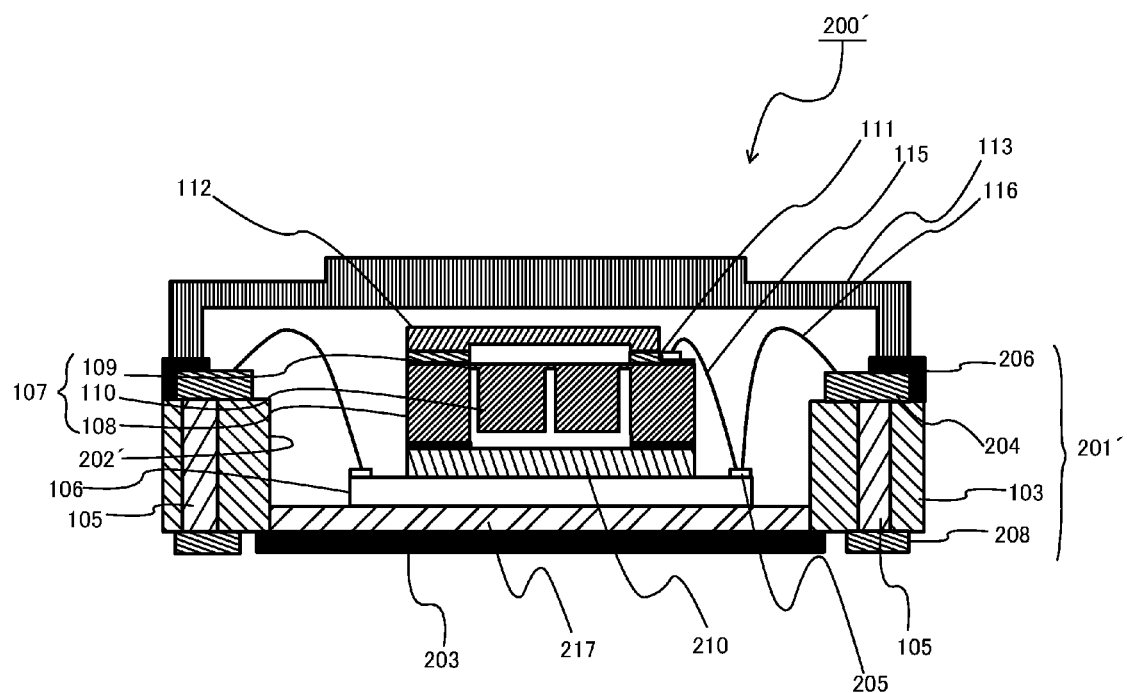
FIG. 14 is a sectional view showing the entire structure of the acceleration sensor device according to the third embodiment of the present invention when an opening is provided in a substrate.

FIG. 14 is a sectional view of an acceleration sensor device 200' in which an opening 202' is formed in a multilayered substrate 201' and a metal substrate 217 having excellent thermal conductivity is arranged so as to close the opening 202' of the multilayered substrate 201'. The multilayered substrate 201' and the metal substrate 217 form a recessed accommodation space (a recessed part) in the acceleration sensor device 200'. With reference to FIG. 14, the acceleration sensor device 200' includes the multilayered substrate 201' having the opening 202', the metal substrate 217 closing the opening 202' of the multilayered substrate 201', the insulating layer 203 covering the metal substrate 217, the control IC 106, the sensor 107, the electrode 111, the sensor upper cap 112, the package cap 113, the electrode 205, the wiring 115, and the wiring 116. The inside of the acceleration sensor device 200' described in FIG. 14 is hollow.

The multilayered substrate 201' includes a first substrate 208 containing a conductive material, the second substrate 103 containing an insulating material, and the third substrate 204 containing a conductive material, and a insulating layer 206 covering part of the third substrate. The conductive material contained in each of the first substrate 208 and the third substrate 204 may be a metal such as copper, silver, gold, nickel, palladium, or the like. As the insulating material contained in the second substrate 103, an insulating resin such as an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide, or others may be used. The resin may be used singly, or two or more types of resins may be used in combination. Furthermore, in addition to the resin, an inorganic filler such as glass, talc, mica, silica, or alumina may be used together. In the present embodiment, an example is described in which the multilayered substrate 201' is formed of four layers including the first substrate 208 and the third substrate 204 which are metal layers respectively, the second substrate 103, and the insulating layer 206. However, the present invention is not restricted to this, the multilayered substrate 201' may be formed of four or less layers including the two metal layers or four or more layers including the two metal layers. As described above, the multilayered substrate 201' has the opening 202', and the metal substrate 217 is arranged so as to close this opening 202'.

The metal substrate 217 is arranged so as to close the opening 202' formed in the multilayered substrate 201'. A surface, which does not face the opening 202' of the multilayered substrate 201', of the metal substrate 217 is covered with the insulating layer 203. As shown in FIG. 14, the multilayered substrate 201' and the metal substrate 217 form the recessed accommodation space (the recessed part) and the control IC 106 is arranged on the metal substrate 217 closing the opening 202' in the multilayered substrate 201'. The metal substrate 217 contains a metal having excellent thermal conductivity, and may contain copper, for example, although this is not restrictive. The metal substrate 217 preferably has a thickness of 15 μm to 80 μm in consideration of the strength of the acceleration sensor device 200'. The control IC 106 is arranged and mounted with an adhesive agent on the metal substrate 217. The components of the acceleration sensor device 200' other than the multilayered substrate 201' and the metal substrate 217 are similar to the structure of the acceleration sensor device 200 described in FIG. 12, and therefore are not described in detail herein.

As shown in FIG. 14, since a part or entire of the control IC 106 and the sensor 107 arranged on the metal substrate 217 are accommodated in the recessed accommodation space (the recessed part) formed by the opening of 202' of the multilayered substrate 201' and the metal substrate 217, the height of the entire the acceleration sensor device 200' can be lowered. Furthermore, since the metal substrate 217 is arranged so as to close the opening 202' formed in the multilayered substrate 201', the strength of the entire the acceleration sensor device 200' is improved, and warping is reduced. Also, the control IC 106 is arranged and mounted on the metal substrate 217 with the adhesive agent. When the metal substrate 217 contains copper, a stress can be reduced in a hot environment and a cool environment since the coefficient of thermal expansion of copper is 17.5 ppm/° C. and is closer to the coefficient of thermal expansion of silicon (3.3 ppm/° C.) used in the control IC 106 rather than the coefficient of thermal expansion of a resin (approximately 20 ppm/° C.). Furthermore, since the metal substrate 217 is a metal substrate having a thermal conductivity higher than the insulating material used in a portion denoted as 102b of the first substrate 102 described in the first embodiment, and therefore has an effect of releasing heat from the control IC 106 and the sensor 107.

Fourth Embodiment

Figure 8B:
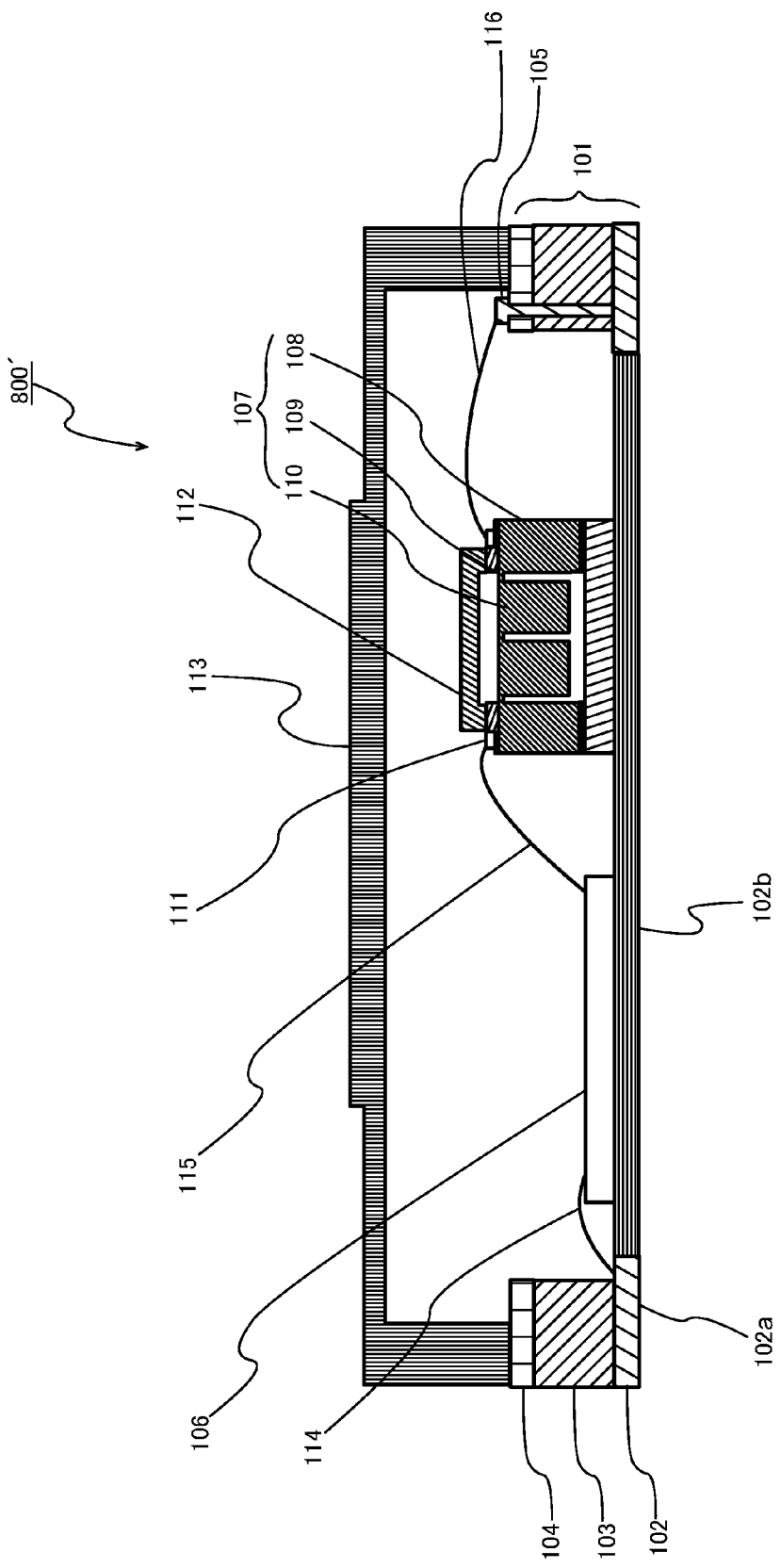
FIG. 8B is another sectional view of the entire structure of the acceleration sensor device.

While the structure in which the control IC is arranged on the substrate and the sensor is arranged on the control IC has been described in the first embodiment to the third embodiments described above, the structure of the acceleration sensor device of the present invention is not restricted to the structure described in the first to third embodiments. FIG. 8A and FIG. 8B are sectional views showing other examples of the entire structure of an acceleration sensor device according to a fourth embodiment of the present invention. FIG. 8A is a sectional view of an acceleration sensor device 800 in which the control IC 106 and the sensor 107 are arranged side by side on the substrate 101 which is the normal substrate shown in FIG. 1A. FIG. 8B is a sectional view of an acceleration sensor device 800' in which the control IC 106 and the sensor 107 are arranged side by side on the substrate 101' which is the cavity substrate shown in FIG. 1B. As shown in FIG. 8A and FIG. 8B, the control IC 106 and the sensor 107 may be arranged side by side on the substrate 101 or 101', necessary wirings and others may be formed, and then they may be covered with the package cap 113 for packaging. In this case, as shown in FIG. 8A and FIG. 8B, the control IC 106 and the sensor 107 may be covered with the same package cap 113 or, although not shown, may be covered with separate package caps. As with the first and second embodiment, the package cap 113 contains an organic material having a value of a coefficient of thermal expansion approximately equal to the value of the coefficient of thermal expansion of the substrate 101 or 101', and the inside of the sensor device is hollow.

Figure 9A:
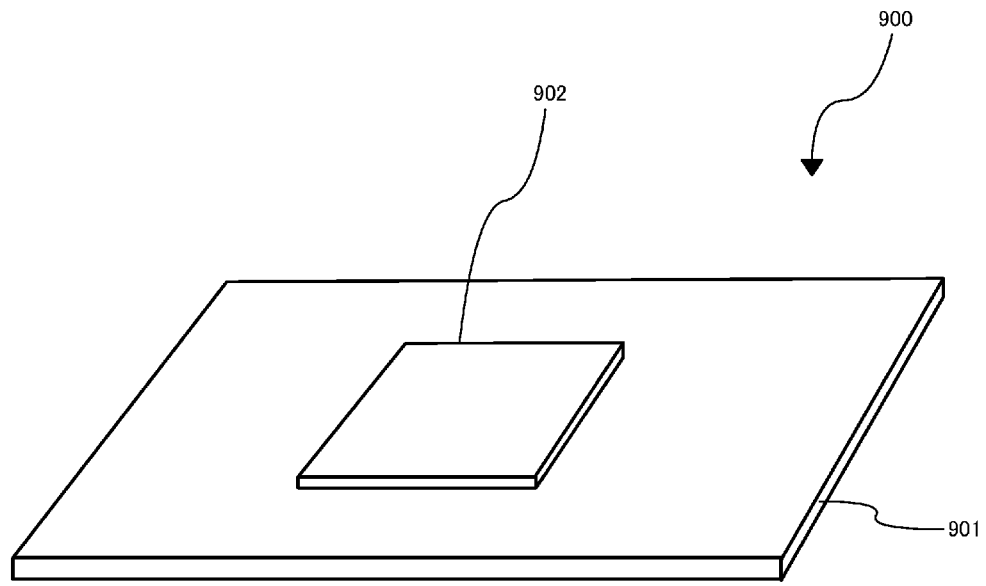
FIG. 9A is a schematic diagram showing an example of a sensor module including a sensor chip.
Figure 9B:
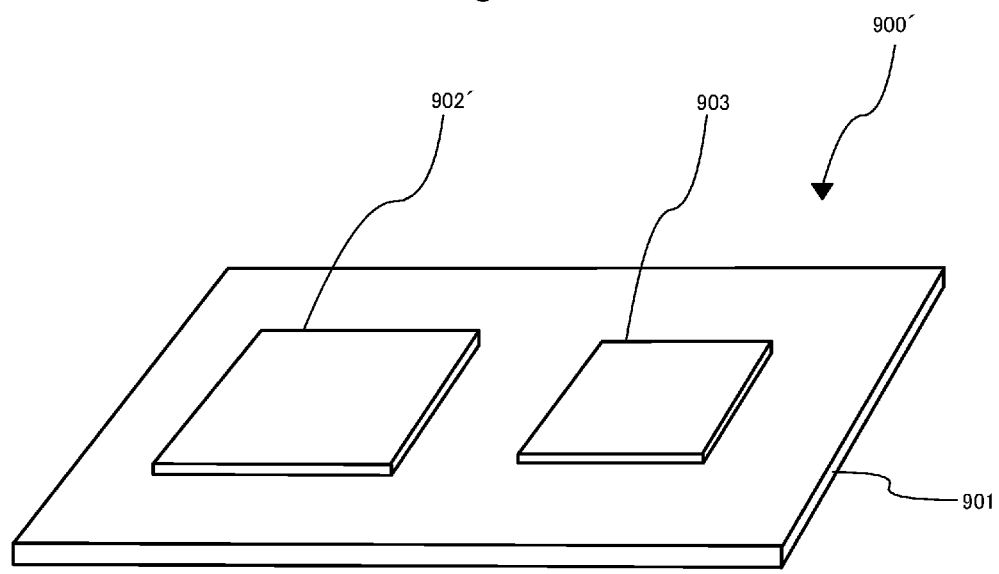
FIG. 9B is a schematic diagram showing an example of a sensor module including a sensor chip and a signal processing chip comprising a control IC.

FIG. 9A and FIG. 9B show semiconductor devices using any of the acceleration sensor devices of the first to fourth embodiments, showing an example of any of the sensor modules 900 and 900'. The sensor modules 900 and 900' may be used, for example, in a portable telephone, a PDA, or the like. Note that a semiconductor device in the specification is assumed to refer to apparatuses that can function by using semiconductor technologies, and electronic components and electronic equipment are assumed to be included in a range of the semiconductor devices.

FIG. 9A shows the sensor module 900 using an acceleration sensor device. The sensor module 900 includes a substrate 901 for mounting and a sensor chip 902. The sensor chip 902 includes any of the acceleration sensor device including a sensor and a control IC which are mounted on a substrate containing an organic material and having one or more wirings and which are covered with a package containing an organic material such as an insulating resin as described in the first to third embodiments.

The substrate 901 for mounting is a substrate made of an organic material, and is configured of an insulating resin, for example. On an upper surface of the substrate 901, wirings (not shown) for electrically connecting to wirings of the sensor chip 902 are formed. As shown in FIG. 9A, when the sensor chip 902 is mounted on the substrate 901, unlike a conventional sensor chip using a ceramic package, the value of the coefficient of thermal expansion of the substrate 901 and the value of the coefficient of thermal expansion of the package of the sensor chip 902 are close to each other. Therefore, reliability in connection between the substrate 901 and the package of the sensor chip 902 is increased, and this is advantageous for a large package, thin package, and narrow gap mountings. The value of the coefficient of thermal expansion of the substrate 901 and the value of the coefficient of thermal expansion of the package of the sensor chip 902 are approximately equal to each other, and a difference in coefficient of thermal expansion therebetween is within ±3 ppm. An adhesive agent bonding the substrate 901 and the package of the sensor chip 902 together is preferably a resin having a value of a coefficient of thermal expansion close to the values of the coefficient of thermal expansion of the substrate 901 and the package of the sensor chip 902. However, the present invention is not restricted to this, and the substrate 901 and the package of the sensor chip 902 may be connected together via a bump.

FIG. 9B shows the sensor module 900' in which a sensor chip and a signal processing chip including a control IC are mounted. Components similar to those of the sensor module 900 shown in FIG. 9A are provided with a same reference numeral, and are not redundantly described herein. The sensor module 900' includes the substrate 901 for mounting, a sensor chip 902', and a signal processing chip 903 including a control IC. The substrate 901 is similar to the substrate 901 shown in FIG. 9A. On an upper surface of the substrate 901 shown in FIG. 9B, wirings (not shown) for electrically connecting to wirings of the sensor chip 902' and wirings of the signal processing chip 903 are formed. The sensor chip 902' includes a sensor mounted on a substrate containing an organic material and having one or more wirings, and is covered with a package containing an organic material such as an insulating resin. The signal processing chip 903 includes a control IC for processing a signal transmitted from the sensor of the sensor chip 902' and others and. As with the sensor of the sensor chip 902', the signal processing chip 903 is mounted on a substrate containing an organic material and having one or more wirings, and is covered with a package containing an organic material such as an insulating resin.

When the sensor chip 902' and the signal processing chip 903 are mounted on the substrate 901, unlike a conventional sensor chip using a ceramic package, the value of the coefficient of thermal expansion of the substrate 901, the value of the coefficient of thermal expansion of the package of the sensor chip 902', and the value of the coefficient of thermal expansion of the signal processing chip 903 are close to each other. Therefore, reliability in connection between the substrate 901 and the package of the sensor chip 902' and between the substrate 901 and the signal processing chip 903 is increased, and this is advantageous for a large package, thin package, and narrow gap mountings. The value of the coefficient of thermal expansion of the substrate 901, the value of the coefficient of thermal expansion of the package of the sensor chip 902', and the value of the coefficient of thermal expansion of the signal processing chip 903 are approximately equal to each other, and a difference in coefficient of thermal expansion thereamong is within ±3 ppm. An adhesive agent bonding the substrate 901, the sensor chip 902', and the signal processing chip 903 together is preferably a resin having a value of a coefficient of thermal expansion close to the values of the coefficient of thermal expansion of the substrate 901, the package of the sensor chip 902', and the signal processing chip 903. However, the present invention is not restricted to this, and the substrate 901, the sensor chip 902', and the signal processing chip 903 may be connected together via a bump.

Like the sensor modules 900 and 900' described above, when a chip mounted on a substrate containing an organic material and covered with a package containing an organic material is mounted on a substrate for mounting which contains an organic material, reliability of a joint therebetween is increased, and therefore reliability of the apparatus can be improved.

What is claimed is:
1. A sensor device comprising:
a substrate including a first substrate, a second substrate arranged on the first substrate and a third substrate arranged on the second substrate, the third substrate containing an organic material, and the substrate being formed a wiring;
an IC arranged on the substrate and connected to the wiring;
an acceleration sensor electrically connected to the IC; the acceleration sensor having a weight part moving according to an external force and a flexible part bending according to a displacement of the weight part and
a package cap arranged on the third substrate, the package cap containing an organic material, the package cap hermetically sealing the IC and the acceleration sensor,
wherein an area defined by the package cap and the substrate is hollow, the acceleration sensor is separated from the package cap by the area, and a value of a coefficient of thermal expansion of the third substrate and a value of a coefficient of thermal expansion of the package cap are substantially equal to each other.
2. The sensor device according to claim 1, wherein
the substrate includes a recessed part, and
the IC and the sensor are partially or entirely accommodated in the recessed part.
3. The sensor device according to claim 2, wherein
the substrate is a multilayered substrate including a metal substrate configuring a bottom of the recessed part, and
the IC is arranged on the metal substrate.
4. The sensor device according to claim 1, wherein
the substrate has an opening,
the sensor device further comprises a metal substrate closing the opening, and
the IC is arranged on the metal substrate.
5. A sensor device manufacturing method comprising:
preparing a substrate including a first substrate, a second substrate arranged on the first substrate and a third substrate arranged on the second substrate, the third substrate containing an organic material and the substrate being formed a wiring;
arranging an IC and an acceleration sensor on the substrate, the sensor having a weight part moving according to an external force and a flexible part bending according to a displacement of the weight part;
electrically connecting the wiring, the IC, and the sensor; and
arranging a package cap containing an organic material on the third substrate to cover the IC and the acceleration sensor for hermetically sealing,
wherein an area defined by the package cap and the substrate is hollow, the acceleration sensor is separated from the package cap by the area, and a value of a coefficient of thermal expansion of the third substrate and a value of a coefficient of thermal expansion of the package cap are substantially equal to each other.
6. The sensor device manufacturing method according to claim 5, wherein
the substrate includes a recessed part, and
the IC and the sensor are partially or entirely accommodated in the recessed part.

7. The sensor device manufacturing method according to claim 5, wherein
there is a hollow between the sensor and the package cap.

8. The sensor device manufacturing method according to claim 6, wherein
the substrate is a multilayered substrate including a metal substrate configuring a bottom of the recessed part, and
the IC is arranged on the metal substrate.

9. A sensor device comprising:
a substrate including a first substrate, a second substrate arranged on the first substrate and a third substrate arranged on the second substrate, the third substrate containing an organic material, and the substrate being formed a wiring;
an IC arranged on the substrate and connected to the wiring;
an acceleration sensor electrically connected to the IC, the acceleration sensor having a weight part moving according to an external force and a flexible part bending according to a displacement of the weight part; and
a package cap arranged on the third substrate, the package cap containing an organic material and hermetically sealing the IC and the acceleration sensor,
wherein the sensor device comprises a hollow portion defined by both of the package cap and the substrate, the acceleration sensor is separated from the package cap by the hollow portion, and a value of a coefficient of thermal expansion of the third substrate and a value of a coefficient of thermal expansion of the package cap are substantially equal to each other.

10. The sensor device according to claim 1, wherein the IC and the acceleration sensor are arranged in a hollow area defined by the package cap and the substrate.

11. The sensor device according to claim 9, wherein the IC and the acceleration sensor are arranged in the hollow portion.

12. The sensor device according to claim 1, wherein the third substrate and the package cap are bonded with an adhesive agent; and
a value of a coefficient of thermal expansion of the adhesive agent is close to the values of the coefficient of thermal expansion of the third substrate and the package cap.

13. The sensor device manufacturing method according to claim 5, wherein arranging a package cap on the third substrate includes bonding the third substrate and the package cap with an adhesive agent; and
a value of a coefficient of thermal expansion of the adhesive agent is close to the values of the coefficient of thermal expansion of the third substrate and the package cap.

14. The sensor device according to claim 9, wherein the third substrate and the package cap are bonded with an adhesive agent; and
a value of a coefficient of thermal expansion of the adhesive agent is close to the values of the coefficient of thermal expansion of the third substrate and the package cap.

15. The sensor device according to claim 1, wherein the organic material contained in the third substrate includes an insulating material selected from a group consisting of an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide and a combination thereof, and the organic material contained in the package cap includes an insulating material selected from a group consisting of an epoxy resin, an acrylic resin, and a polyimide resin.

16. The sensor device manufacturing method according to claim 5, wherein the organic material contained in the third substrate includes an insulating material selected from a group consisting of an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide and a combination thereof, and the organic material contained in the package cap includes an insulating material selected from a group consisting of an epoxy resin, an acrylic resin, and a polyimide resin.

17. The sensor device according to claim 9, wherein the organic material contained in the third substrate includes an insulating material selected from a group consisting of an epoxy resin, a polyimide resin, a benzocyclobutene resin, polyamide, a phenol resin, a silicone resin, a fluoro resin, a liquid-crystal polymer, polyamide imide, polybenzoxazole, a cyanate resin, aramid, polyolefin, polyester, BT resin, FR-4, FR-5, polyacetal, polybutylene terephthalate, syndiotactic polystyrene, polyphenylene sulfide, polyether ether ketone, polyether nitrile, polycarbonate, polyphenylene ether polysulfone, polyether sulfone, polyarylate, polyether imide and a combination thereof, and the organic material contained in the package cap includes an insulating material selected from a group consisting of an epoxy resin, an acrylic resin, and a polyimide resin.

* * * * *